United States Patent

Sharp

[11] Patent Number: 5,914,599
[45] Date of Patent: Jun. 22, 1999

[54] COMPENSATION FOR INHOMOGENEITY OF THE FIELD GENERATED BY THE RF COIL IN A NUCLEAR MAGNETIC RESONANCE SYSTEM

[75] Inventor: Jonathan C. Sharp, Winnipeg, Canada

[73] Assignee: National Research Council of Canada, Ottawa, Canada

[21] Appl. No.: 08/698,269

[22] Filed: Aug. 19, 1996

Related U.S. Application Data

[60] Provisional application No. 60/002,522, Aug. 18, 1995.

[51] Int. Cl.$^6$ .................................................. G01R 33/00
[52] U.S. Cl. .......................... 324/318; 324/309; 324/319
[58] Field of Search ................................... 324/306, 307, 324/309, 318, 319, 314

[56] References Cited

U.S. PATENT DOCUMENTS

| | | | |
|---|---|---|---|
| 4,385,277 | 5/1983 | Hanley | 324/319 |
| 4,625,169 | 11/1986 | Wedeen et al. | 324/309 |
| 4,644,473 | 2/1987 | Kojima et al. | 324/309 |
| 4,703,274 | 10/1987 | Kaufman et al. | 324/309 |
| 5,023,554 | 6/1991 | Cho et al. | 324/318 |
| 5,160,888 | 11/1992 | Laukien | 324/309 |
| 5,214,381 | 5/1993 | Cory | 324/309 |
| 5,323,113 | 6/1994 | Cory et al. | 324/318 |

OTHER PUBLICATIONS

Review Article—Composite Pulses (62 pages).
Review Article—Insensitive Adiabatic RF Pulses (39 pages).
Research Article—Magnetic Field Mapping (6 pages).
Research Article –BIRP, An Improved Implementation of Low–Angle Adiabatic (BIR–4) Excitation Pulses (3 pages).

*Primary Examiner*—John Barlow
*Assistant Examiner*—Bryan Bui
*Attorney, Agent, or Firm*—Adrian D. Battison; Murray E. Thrift

[57] ABSTRACT

This invention relates to a technique for compensating for the inhomogeneity of the field generated by the RF coil (B1) in a nuclear magnetic resonance experiment. Current techniques for achieving accurate flip angles with non-uniform B1 transmit fields, are based upon modulation of the RF waveform. Inherent disadvantages of any RF-based compensation is an increased pulse length and/or increased RF power. Moreover, for some important applications, e.g. multi-slice excitation, no suitable pulses are known. We present an alternative strategy involving a Bz field whose spatial variation is correlated with that of the B1 field. This spatial correlation between the fields allows Bz-based compensation for the effects of B1 inhomogeneity. Successful operation over a wide bandwidth and range of B1 intensities may be achieved without any modification of the RF pulses. An alternative approach for compensating for B1 inhomogeneity is to apply a rapid oscillatory phase-modulation to an existing RF pulse waveform. This approach does not require an additional Bz field, but does not have the minimum RF power advantage of the first approach.

12 Claims, 26 Drawing Sheets

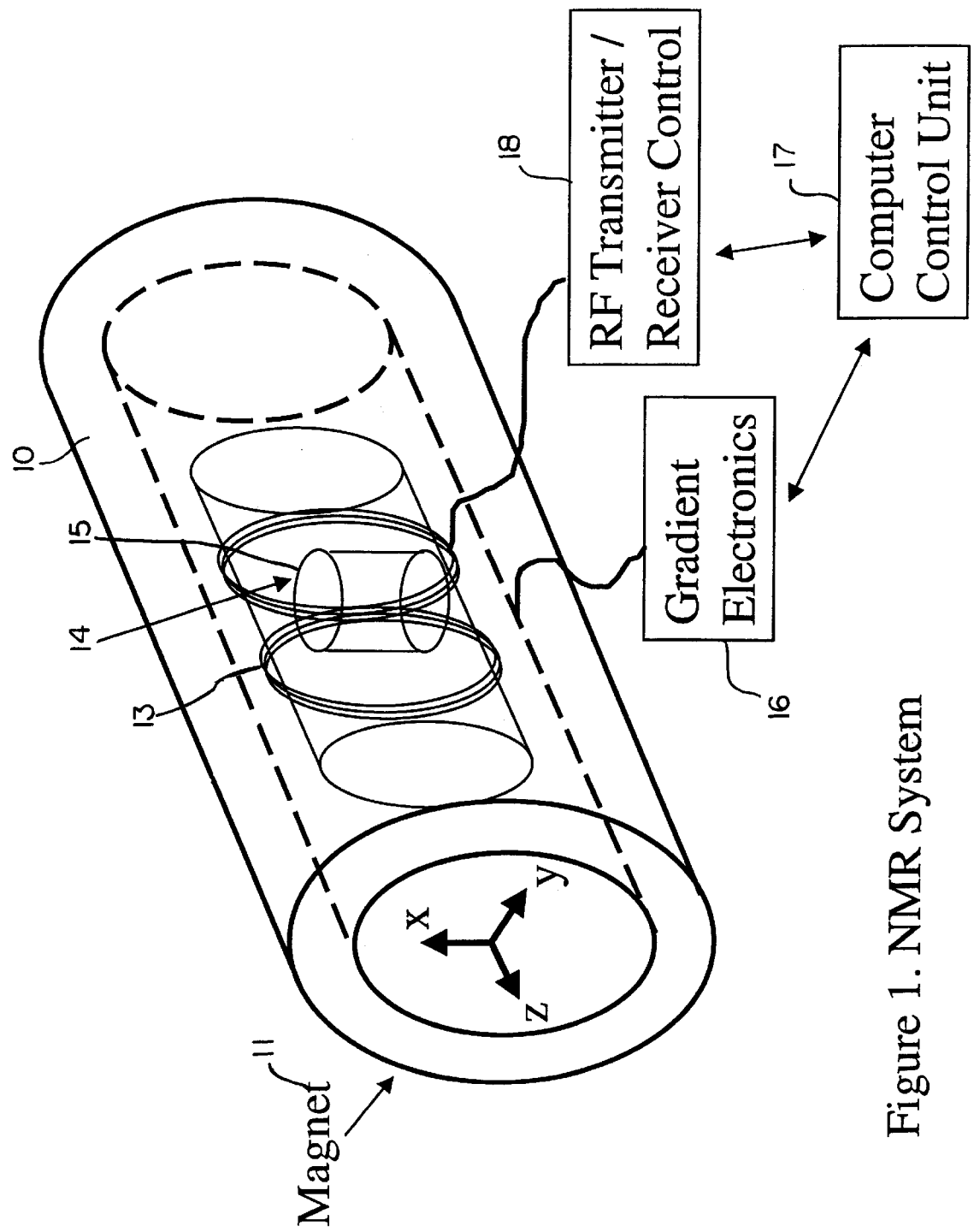
Figure 1. NMR System

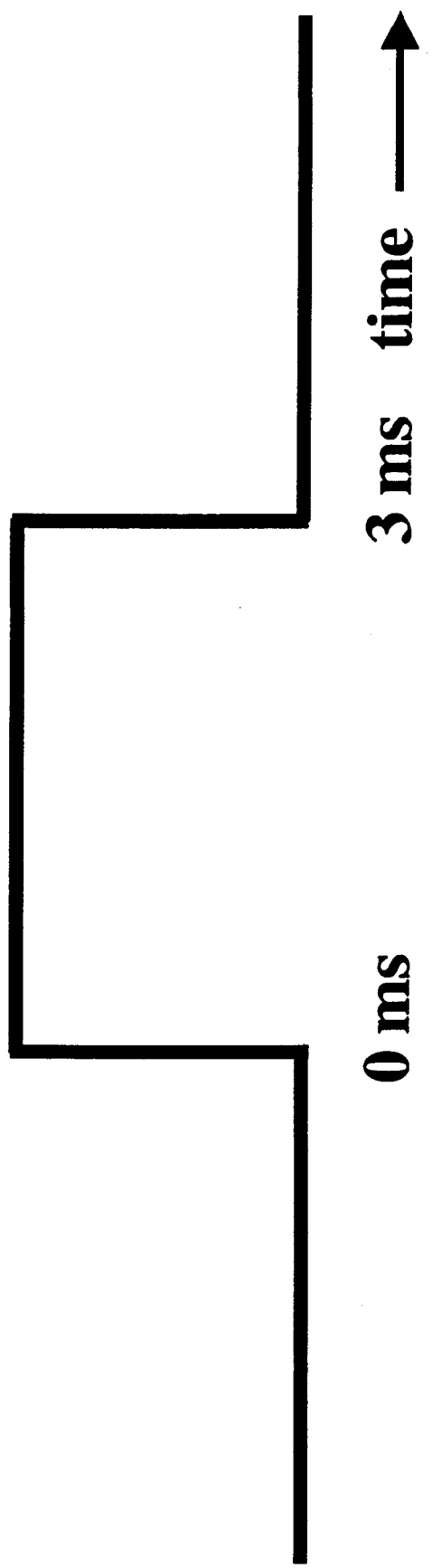

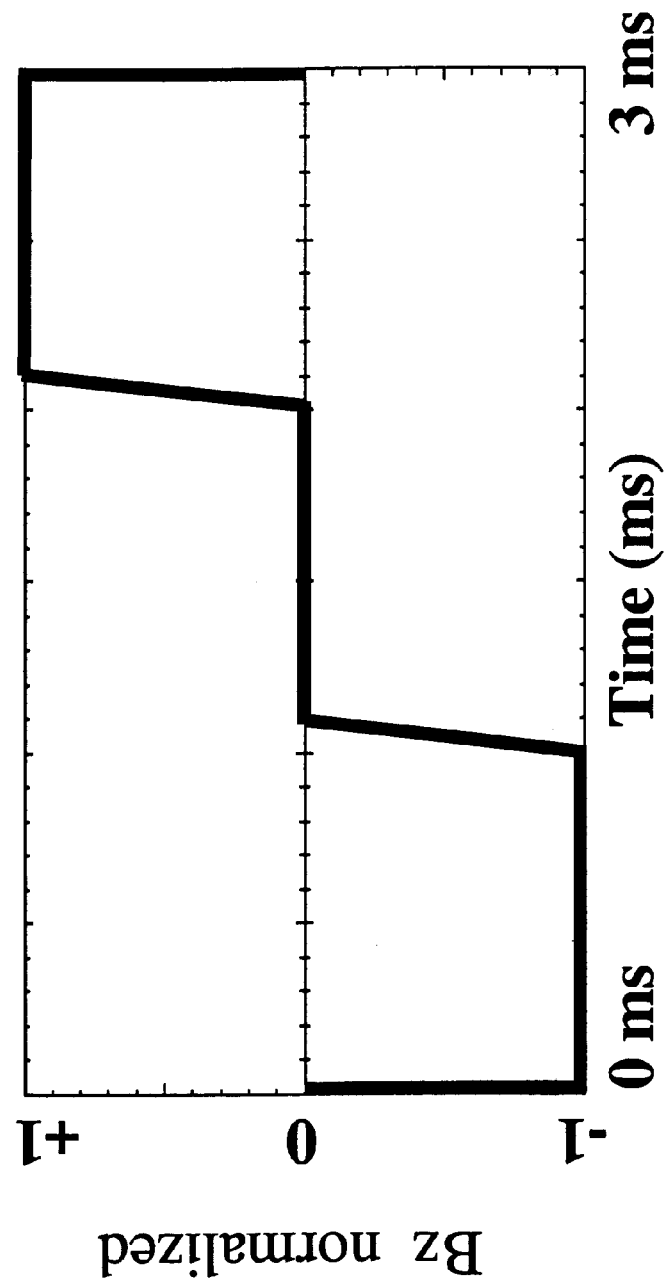

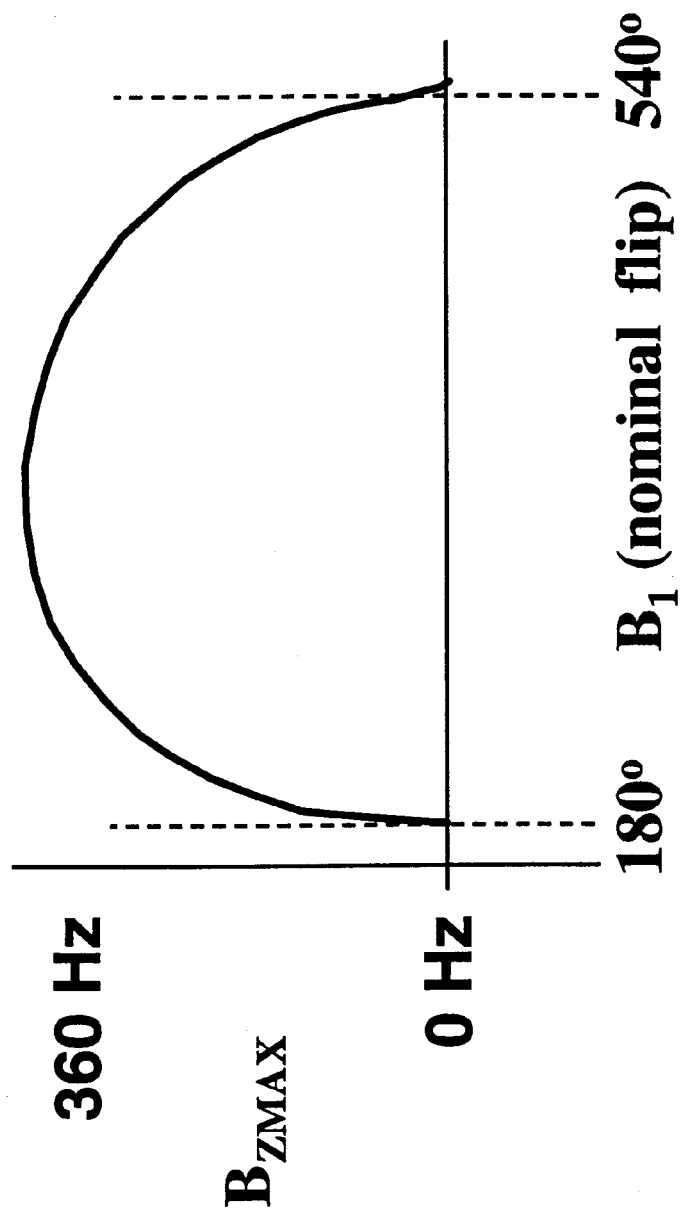

$B_Z$ Gradient Waveform

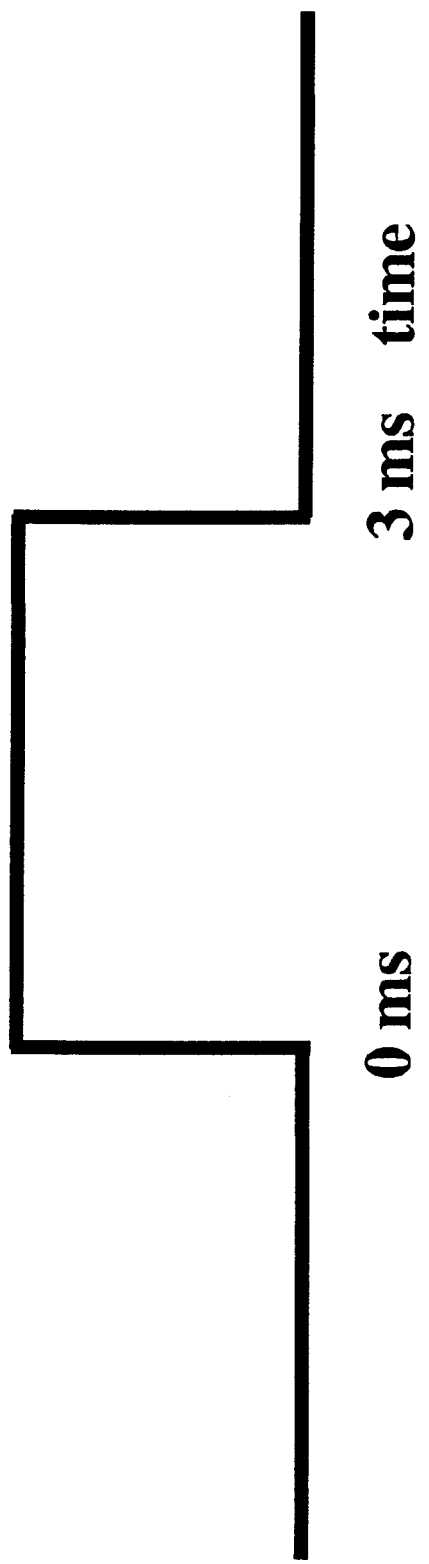

| Flip Angle B1(deg) | Bz (Hz) |
|---|---|
| 180.0000 | 0.0000 |
| 184.7458 | 757.5757 |
| 189.4915 | 1060.6061 |
| 194.2373 | 1313.1313 |
| 198.9830 | 1515.1515 |
| 203.7288 | 1666.6666 |
| 208.4746 | 1818.1819 |
| 213.2203 | 1969.6970 |
| 217.9661 | 2070.7070 |
| 222.7119 | 2171.7173 |
| 227.4576 | 2272.7273 |
| 232.2034 | 2373.7373 |
| 236.9492 | 2474.7476 |
| 241.6949 | 2525.2524 |
| 246.4407 | 2626.2627 |
| 251.1864 | 2676.7676 |
| 255.9322 | 2727.2727 |
| 260.6780 | 2828.2827 |
| 265.4237 | 2878.7878 |
| 270.1695 | 2929.2930 |
| 274.9153 | 2979.7981 |
| 279.6610 | 3030.3030 |
| 284.4068 | 3080.8081 |
| 289.1525 | 3131.3132 |
| 293.8983 | 3181.8181 |
| 298.6441 | 3232.3232 |
| 303.3898 | 3282.8284 |
| 308.1356 | 3333.3333 |
| 312.8813 | 3383.8384 |
| 317.6271 | 3383.8384 |
| 322.3729 | 3434.3435 |
| 327.1187 | 3484.8484 |
| 331.8644 | 3484.8484 |
| 336.6102 | 3535.3535 |
| 341.3560 | 3585.8586 |
| 346.1017 | 3585.8586 |
| 350.8475 | 3636.3638 |
| 355.5932 | 3686.8687 |
| 360.3390 | 3686.8687 |
| 365.0847 | 3737.3738 |
| 369.8305 | 3737.3738 |
| 374.5763 | 3787.8789 |
| 379.3220 | 3787.8789 |
| 384.0678 | 3838.3838 |
| 388.8136 | 3838.3838 |
| 393.5593 | 3888.8889 |
| 398.3051 | 3888.8889 |
| 403.0508 | 3939.3940 |
| 407.7966 | 3939.3940 |
| 412.5424 | 3989.8989 |
| 417.2881 | 3989.8989 |
| 422.0339 | 3989.8989 |
| 426.7797 | 4040.4041 |
| 431.5255 | 4040.4041 |
| 436.2712 | 4040.4041 |
| 441.0170 | 4090.9092 |
| 445.7627 | 4090.9092 |
| 450.5085 | 4141.4141 |
| 455.2542 | 4141.4141 |

Fig. 4C

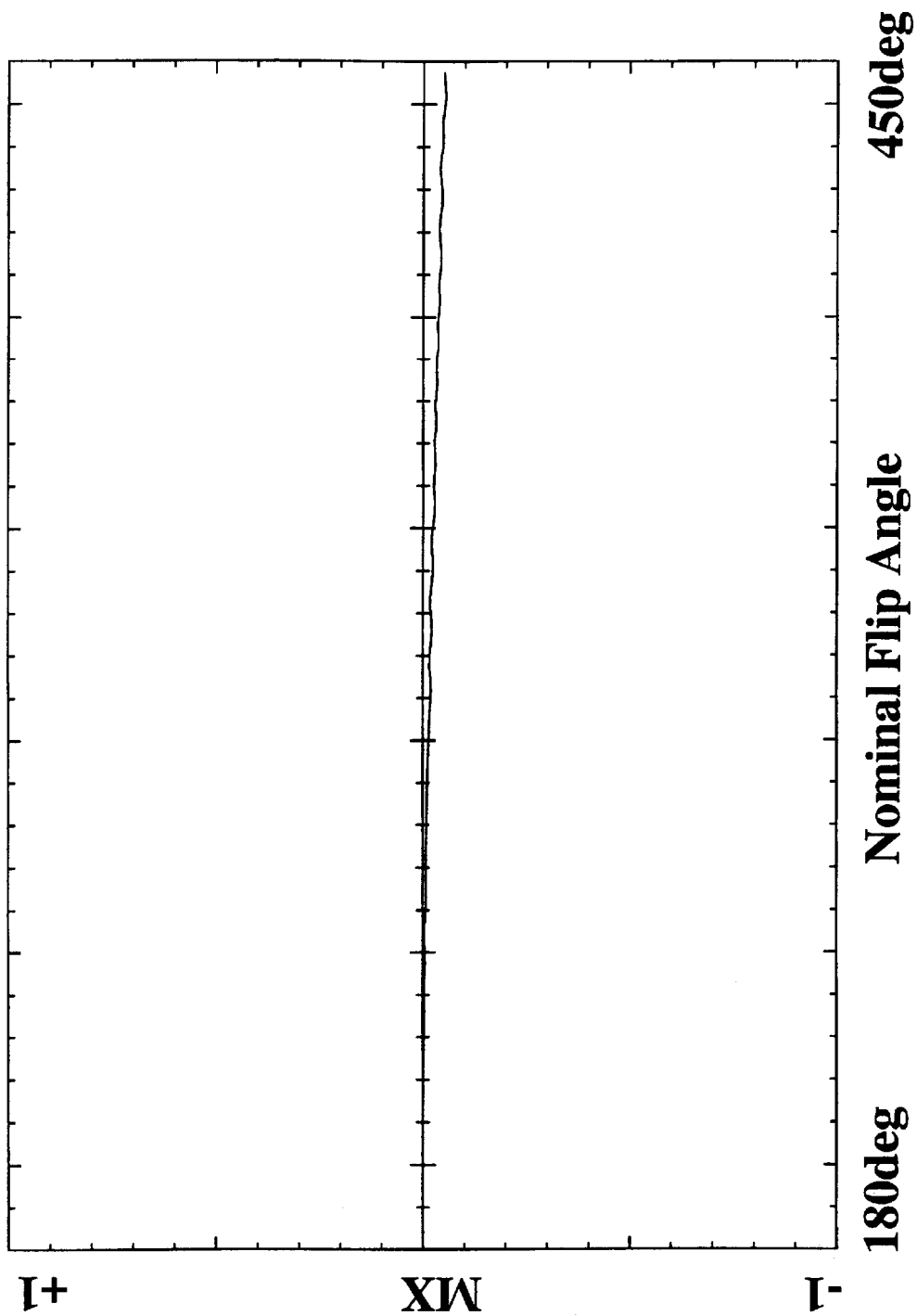

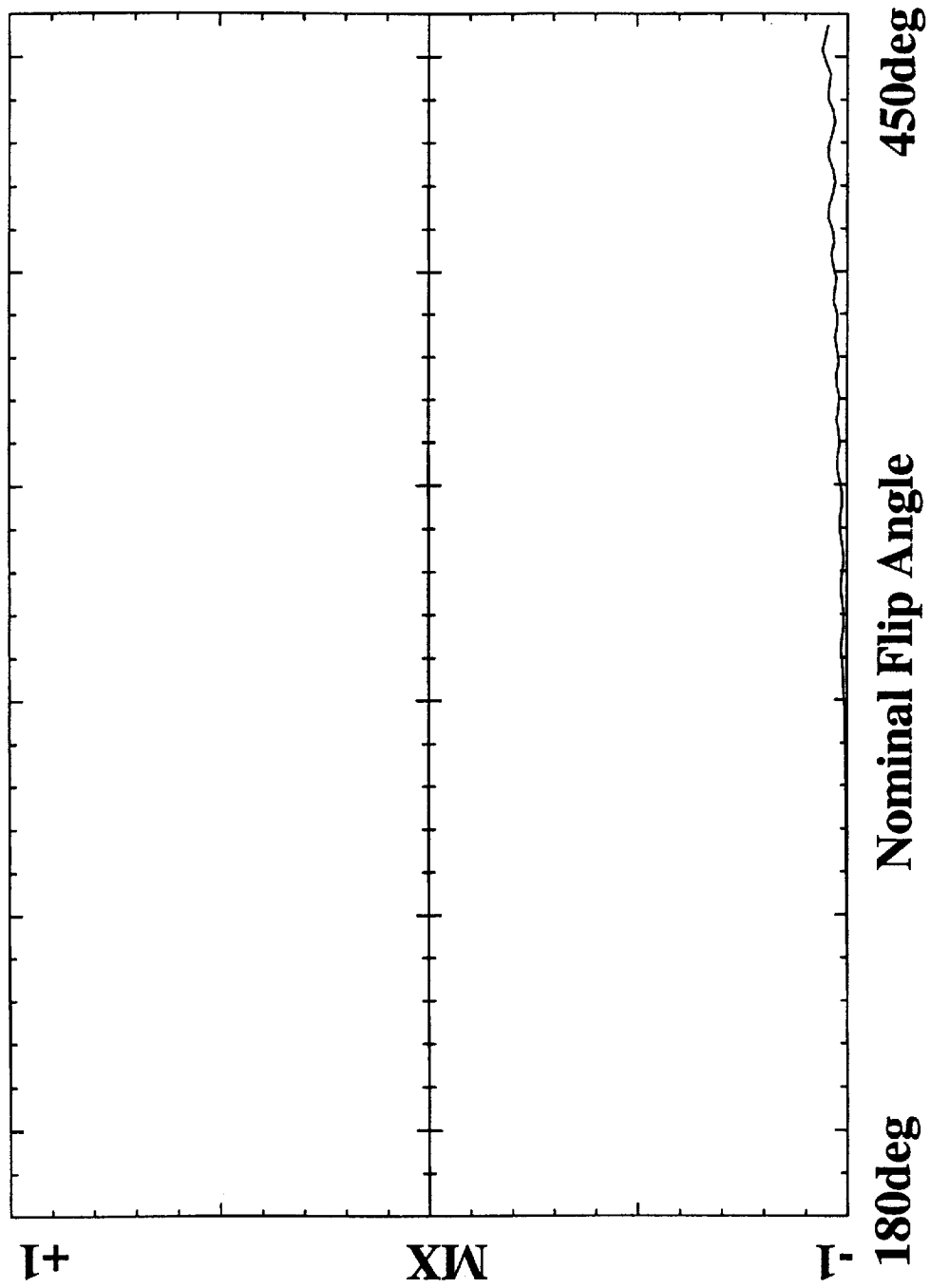

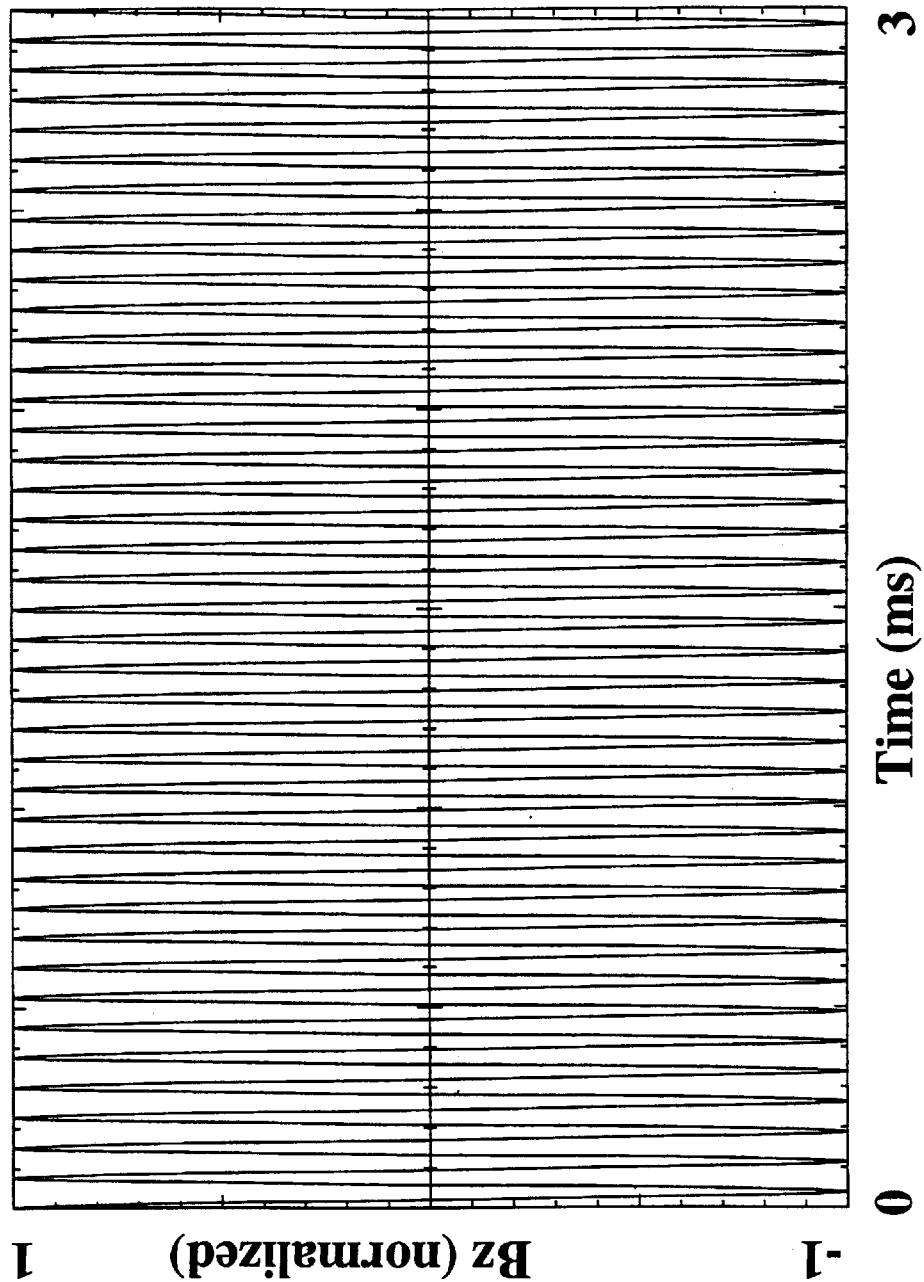

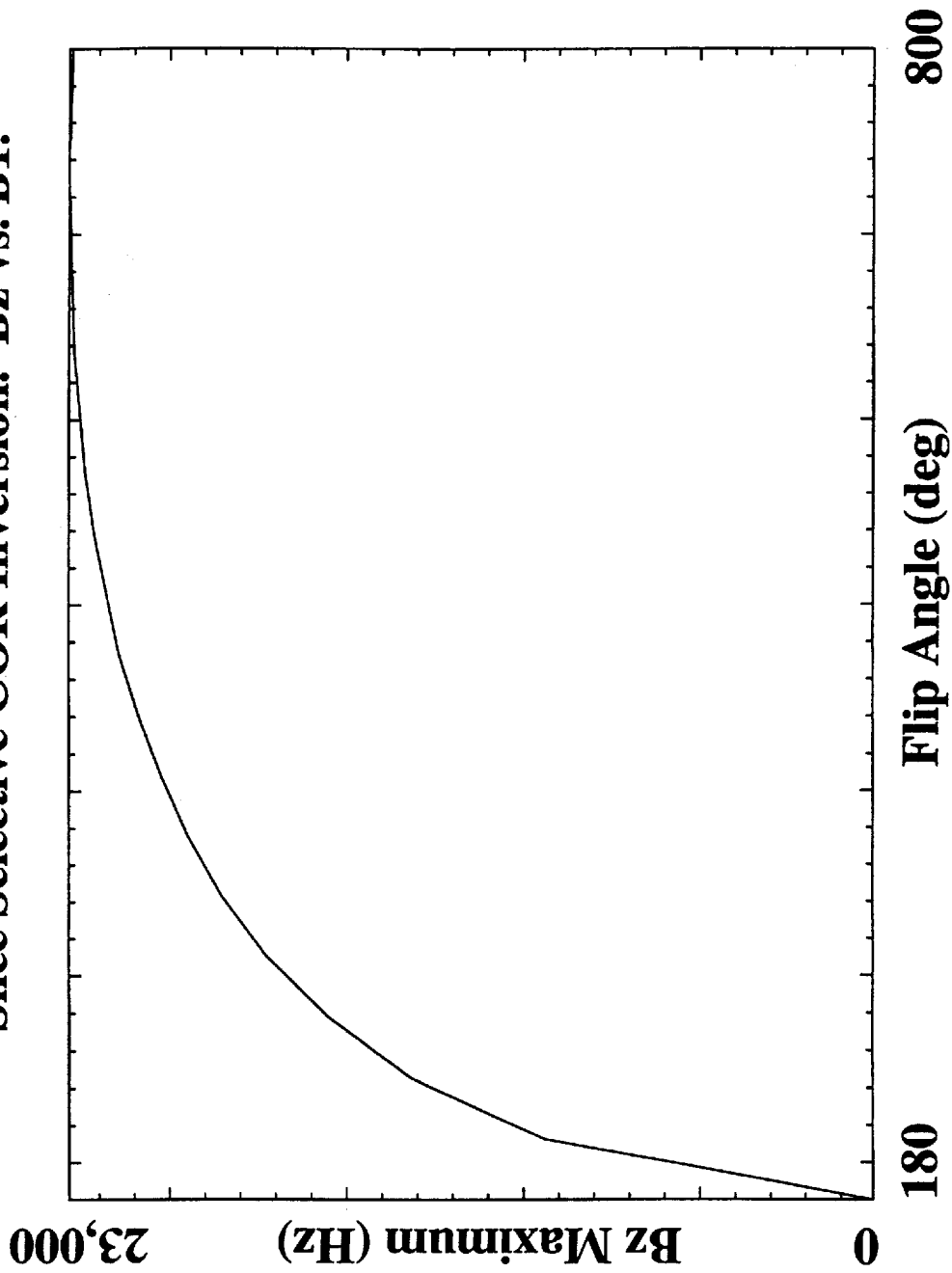

Slice Selective COR Inversion. Inversion Profile

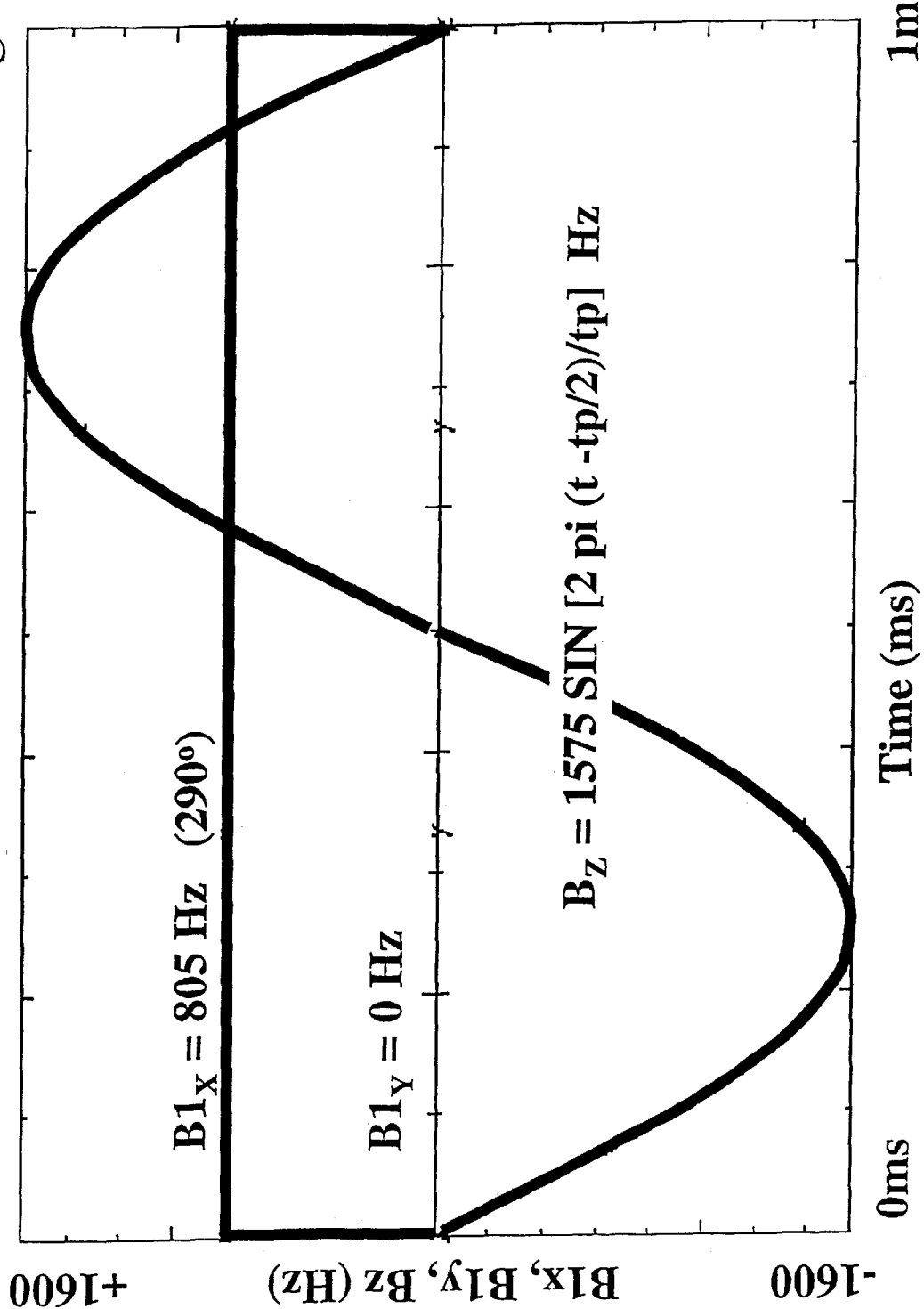

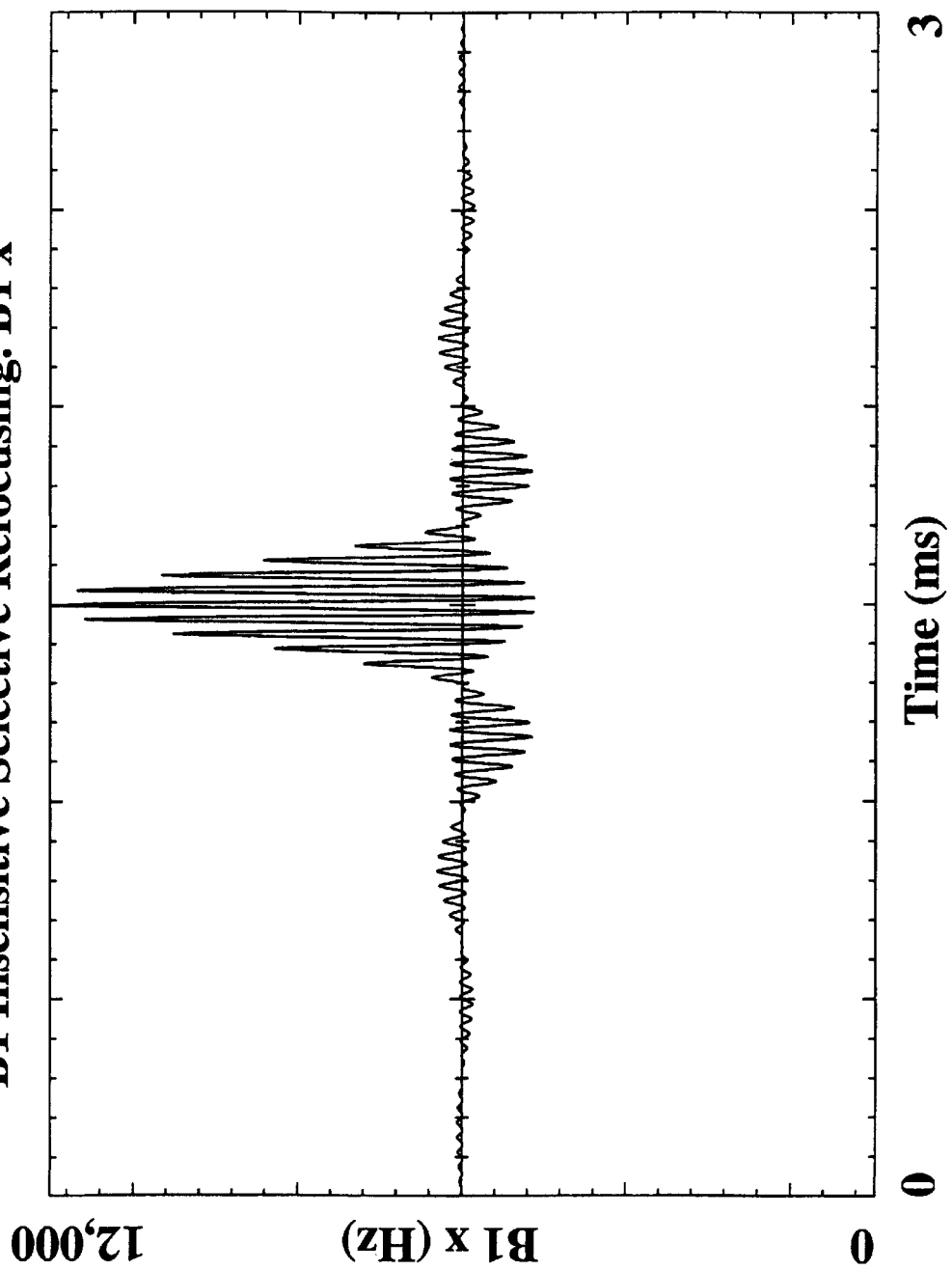

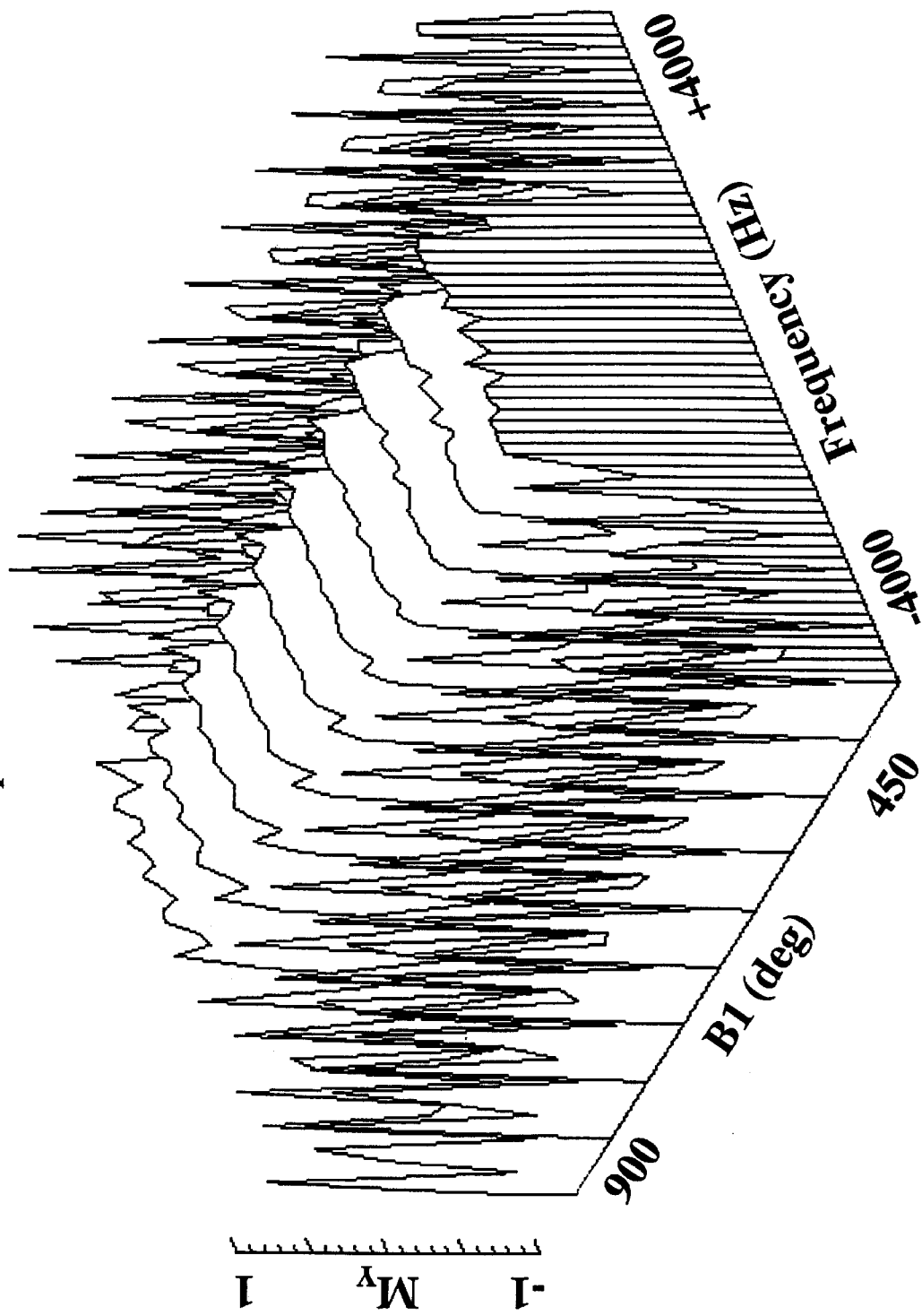

COMPENSATION FOR INHOMOGENEITY OF THE FIELD GENERATED BY THE RF COIL IN A NUCLEAR MAGNETIC RESONANCE SYSTEM

This application claims benefit of provisional application No. 60/002,522 filed Sep. 18, 1995.

BACKGROUND OF THE INVENTION

This Invention relates to a technique for compensating for the inhomogeneity of the field generated by the RF coil in a nuclear magnetic resonance experiment.

This work addresses a problem which occurs in Nuclear Magnetic Resonance (NMR) experiments. These experiments include NMR spectroscopy (MRS), and NMR imaging (MRI). NMR experiments may be performed on both living subjects and samples such as chemical solutions. Some examples of NMR experiments are diagnostic medical imaging (MRI), and determination of chemical structures by NMR spectroscopy.

A central feature of all NMR experiments is the precise spatial and temporal control of a number of magnetic fields applied to the sample or subject (for the case of in vivo experiments).

'$B_0$' refers to the uniform, strong static magnetic field, usually produced using a superconducting magnet. This field is fine-tuned using "shim" coils. NMR imaging and localized spectroscopy additionally use switched linear $B_0$ field gradients. Some forms of spectroscopy also employ switched gradients. $B_z$ is the component of magnetic field in the z-direction. The z-direction is defined by the direction of the $B_0$ field.

'$B_1$' refers to the radio frequency (RF) field, which is normally pulsed, and is produced using a tuned probe (the RF coil). The most basic function of the transmitted RF pulse is to excite the spins (magnetic atomic nuclei) away from their equilibrium alignment. This causes a small NMR RF signal to be emitted by the sample which is detected using an RF receiver coil and sensitive receiver electronics. The same RF coil is often used for both transmission of RF pulses and reception of NMR signals from the sample.

RF pulses are an essential part of any Fourier transform (FT) NMR experiment, and the use of pulses of the correct amplitude is usually most important. It is therefore desirable to use a coil which has a uniform $B_1$ field over the sample, in order that the effect of the RF pulse is the same throughout the sample. However, compromises are often made in order to increase signal-to-noise ratio (SNR) and additionally various technical problems exist in the production of a uniform field in certain circumstances.

The $B_1$ field is in the radio frequency (RF) range for NMR. Some Electron Spin Resonance (ESR), also known as Electron Paramagnetic Resonance, experiments use very similar methods to NMR, therefore the methods discussed could also in principle be applied to ESR, but $B_1$ is normally in the microwave region for ESR experiments. For simplicity the term "RF" will be used throughout this document.

Incorrect $B_1$ field intensity can occur for a variety of reasons, these include incorrect calibration of the RF pulse amplitude, instability or drift of the RF amplifier or other RF electronics, non-uniform RF transmitter coils and by interactions with lossy samples. The result is that improper flip angles are produced, resulting in a wide variety of undesirable effects in the NMR experiments. The SNR may be reduced, and the measurement accuracy is impaired.

In one solution, a uniform transmitter coil and a separate local receiver coil (surface coil) is used. This commonly used arrangement can be suitable when the region of the sample being studied is a relatively small fraction of the total sample size, and is located near to the surface. The large transmitter coil has effectively a uniform field over the volume of interest eliminating the problem, while the small receiver coil allows good sensitivity for reception of the NMR signal.

One limitation of this approach is that there is not always enough space for two RF coils to be used. Clinical head imaging is an example where it is preferable to use only one RF coil, and so coil homogeneity may be sacrificed for sensitivity. A large RF coil requires a more powerful RF amplifier and results in RF heating of a larger part of the body. Furthermore, the more space that is required for RF coils, the less space is available for the sample, and for the gradient and shim coils. The use of larger gradient coils requires higher currents which are more expensive to produce. If a larger magnet is required to accommodate larger gradient and RF coils then this is also more expensive.

In another solution a special RF coil can be designed to compensate for RF losses and interactions with the sample. In some cases an RF coil which has a uniform field in air, nevertheless produces a non-uniform field within a sample. It is sometimes possible to design an RF coil, albeit with decreased efficiency, to compensate for this. Such an RF coil would have to be designed for a specific sample conductivity distribution.

Another widely used technique uses special pulse shapes particularly modification of the amplitude and phase of the RF pulse waveforms. By using specially designed RF pulses the effects of variations of the RF field strength can be reduced. A unique advantage of this approach is that errors in setting the gain of the RF transmitter are also compensated. The two main categories of compensated RF pulses are:

Composite RF pulses (1)
"Adiabatic" pulses (2), (3).

General disadvantages are that these pulses are either longer, or require more RF power than uncompensated pulses or both. Additional RF power entails either higher RF voltage or a longer pulse (or both). For In vivo experiments especially, the RF power deposition is limited to a safe maximum value, which varies depending upon specific experimental conditions. In clinical imaging and especially when operating at higher $B_0$ field values considerations of safety and sample heating due to deposition of RF energy imposes significant restrictions on the execution of NMR measurements. Any methods requiring less RF power therefore would have an important advantage over competing methods.

Specific disadvantages of composite pulses are that they generally are compensated for either off-resonance performance, or for $B_1$ intensity variations, but not both. Furthermore composite pulses, built-up from a series of short, "hard" pulses are not suitable for slice selection in MRI.

Specific disadvantages of adiabatic pulses are that slice selective excitation and slice selective refocusing cannot be satisfactorily achieved, with the result that these pulses are not routinely used in MRI. Good adiabatic selective inversion pulses do exist.

Other relevant prior art, which provides further detail of the above, is shown in:

1. P. A. Bottomley et al BIRP, An improved implementation of low angle adiabatic excitation pulses, Journal of Magnetic Resonance Series A 103, 242 to 244 (1993).

2. J. P. Hornak et al, Magnetic field mapping, Magnetic Resonance Medical 6 158 to 163 (1988).

3. M. H. Levitt Prog. NMR Spectroscopy 18:61 to 122 (1968).

4. M. Garwood et al, B1 Insensitive adiabatic pulses, NMR Basic Principles and Progress Vol 26 Springer-Verlag, Berlin Heidelberg (1992).

SUMMARY OF THE INVENTION

It is one object of the present invention therefore to provide an improved method for compensating for the inhomogeneity of the RF transmitter field in an NMR experiment.

According to a first aspect of the invention ($B_1$-insensitive pulses) there is provided a method of performing nuclear magnetic resonance measurements in order to analyze a sample (the sample being of any type whatsoever, including living subjects), comprising:

providing at least one magnet generating a magnetic field $B_0$ which is substantially static during the experiment and substantially spatially uniform over the sample, the magnetic field direction defining a z-reference axis along the longitudinal direction of the magnet;

providing at least one radiofrequency (RF) coil and applying an RF signal (normally in the form of a series of one or more pulses) to the RF coil to generate an RF field $B_1$, the RF coil and sample having characteristics such that the field generated is non-homogeneous (spatially non-uniform) over at least part of the sample;

and compensating for the non-homogeneity of the RF field by applying an additional phase (or an equivalent frequency modulation) to an initial RF pulse, consisting of a time-dependent phase function, $\beta(t)$. The phase modulation of an initial pulse $B_1^{init}$ by the time-dependent phase function, $\beta(t)$, is represented by:

$$B_{1M} = B_1^{init} exp(-i\beta(t)).$$

Since angular frequency is the rate of change of phase, the phase modulation may also be expressed as a frequency modulation function given by $\Omega(t) = d\beta(t)dt$.

wherein the form of frequency modulation function, $\Omega(t)$, claimed is one that is substantially oscillating, that is reversing in sign periodically during the pulse;

and wherein the oscillation is sufficiently rapid such that at least one, but possibly many, cycles of frequency modulation occur during each pulse.

Preferably the initial RF pulse has one or more identifiable desirable properties, such excitation or refocusing properties, or a specific frequency response (e.g. for slice selection in magnetic resonance imaging).

Preferably the frequency modulation function is of the general form:

$$\Omega(t) = 2\pi C \sin(\Phi + \omega t) \text{ radians}$$

where C and $\Phi$ are constants.

Preferably given that the $B_1^{init}$ varies in amplitude predominantly over a time-scale of tp, (i.e. the pulse operates over a frequency bandwidth of approximately $2\pi/tp$ radians,) with the condition: $\omega > 2\pi/tp$ radians.

Preferably the constant $\Phi$ is determined to optimize the $B_1$ insensitive properties of the pulse.

Preferably the modulation amplitude C is determined by inspection of the magnetization response to the pulse as one of the values exhibiting insensitivity of the magnetization response to $B_1$ intensity.

Preferably the modulation is effected by modulation of the phase or frequency of the envelope of the $B_1$ pulse.

Preferably the modulation is effected by modulation of the frequency or phase of the $B_1$ transmitter.

Preferably the modulation is effected by modulation of the amplitude of the $B_z$ field.

This method (B1 insensitive Pulses) has the following features a) purpose: $B_1$ insensitive RF pulses for NMR imaging and spectroscopy b) method: modulation of RF pulse waveforms using an oscillatory frequency modulation function c) a moderate degree of immunity to RF inhomogeneity is imparted to the RF pulse d) effective with a wide range of existing RF pulses, retaining the frequency response over a specified range of frequency offsets and retaining other desirable features. These pulses are therefore much more flexible than adiabatic pulses.

e) The main advantage of these pulses is that, over a specified bandwidth, the frequency response of an existing RF pulse may be retained, but the pulse becomes, to an approximately first order, immune to $B_1$ variations. Therefore excellent slice profiles and other desirable properties (e.g. spin refocusing) becomes available.

f) the $B_1$ pulses can be used on existing MRI equipment.

g) RF power requirement may be higher than for conventional pulses, h) Aliasing of response at the modulation frequency and above, leading to a limitation on the usable frequency bandwidth.

i) Suitable for use with surface coils or any other coils with non-uniform $B_1$ response including high field volume coils.

j) Reduced immunity to system and subject variations, less accurate adjustments or RF amplitude needed.

k) NMR spectroscopy: the aliasing of response does not matter if it is outside the spectral bandwidth of interest, also the higher RF power requirements are less of a restriction than they are in vivo. These pulses could make many high resolution NMR experiments much less sensitive to experimental variations.

l) Some of these pulses are slice selective, and may be used for multislice imaging, with some restrictions, and so could become routinely used in some MRI applications.

The invention therefore provides a class of shaped $B_1$ (synonym 'RF') pulses for NMR/MRI pulse sequence applications which possess an insensitivity to variations in $B_1$ intensity ("$B_1$ Insensitive Pulses"), and which can be characterized as consisting of these two elements:

a) Some given complex $B_1$ pulse, $B_1^{init}$, ( hereafter referred to as the "initial pulse"), which may be of any form, subject to the condition that the initial pulse has one or more identifiable desirable properties, for instance, excitation or refocusing properties, or a specific frequency response (e.g. slice selection for MRI). Many such pulses are prior art. The initial pulse may be of a very simple form e.g. a rectangular pulse (hard pulse) or a sinc pulse (sin(x)/x), and is not necessarily phase modulated.

b) A phase (or equivalently frequency) modulation of the initial $B_1$ pulse, $B_1^{init}$, c) Phase modulation of $B_1^{init}$ a time-varying phase function, $\beta(t)$, may be represented by: $B_{1M}=B_1^{init}\exp(-i\beta(t))$. Angular frequency is the rate of change of phase so this phase modulation may also be expressed as a frequency modulation of $\Omega(t)=d\beta(t)/dt$. The form of frequency modulation function claimed is one that is substantially oscillating, i.e. reversing in sign multiple times during the pulse, for example: $\Omega(t)=2\pi C\sin(\Phi+\omega t)$ radians. Furthermore this frequency oscillation must be rapid relative to the amplitude modulation of the initial pulse, $B_1^{init}$. For example if $B_1^{init}$ varies in amplitude predominantly over a time scale of tp, i.e. operating over a frequency bandwidth of approximately $2\pi/tp$ radians, then the condition is that: $\omega > 2\pi/tp$ radians, where tp is the pulse duration.

d) The modulation can be physically achieved by means of:

phase or frequency modulation of the $B_1$ envelope of the initial $B_1$ pulse, or frequency modulation of the $B_1$ pulse transmitter, or field modulation of the $B_Z$ field.

As is well known to one skilled in the art all of these methods are essentially equivalent from the point of view of the physics of the nuclear spins and may be used either alone or in combination. The $B_1$-insensitive behavior is a consequence of the phase or frequency modulation and subject to the property that:

e) the identified desirable properties of the initial $B_1$ pulse are substantially preserved over a "usable frequency range", when an appropriate (higher) $B_1$ intensity is used in place of the intensity of the original RF pulse. "Usable frequency range" is defined as a range of frequencies over which the desired properties hold. For the case of slice selection this includes both the slice bandwidth and the undisturbed region outside the slice.

Additionally, variation of the amplitude of the oscillatory frequency modulation as a function of spatial position to further and better correct for inhomogeneity of the transmitting $B_1$ field ("Correlated Rotation Pulses"), with the advantages of reduced RF power requirements. This is physically achieved using $B_Z$ coils ("gradient coils")

Specifically excluded are the prior art "adiabatic pulses", such as adiabatic half passage (AHP) pulses, or the adiabatic full passage (AFP) hyperbolic secant inversion pulse. AHP pulses sweep from off-resonance to on-resonance i.e. a ¼ cycle of frequency modulation is executed. AFP pulses execute a ½ cycle sweep for example from a positive off-resonance condition to a negative off-resonance condition, Some composite adiabatic pulses (BIR-4, Garwood) use repeated adiabatic sweeps for the purposes of compensation, In this case four sweeps. However each segment on its own is functioning as an adiabatic pulse, containing only a ¼ cycle of frequency sweep.

The method is distinguished from adiabatic pulses as follows:

f) by the rapidity of the frequency modulation relative to the amplitude modulation of the pulse.

g) The difference in behavior: adiabatic sweep pulses can have large immunity to $B_1$ intensity over a wide range of $B_Z$ values, but at the expense of the loss of other desirable pulse properties, (e.g. the control of phase response required for excitation or refocusing).

h) adiabatic pulses cannot be decomposed into the two components of a rapid frequency modulation and an initial pulse with the same properties as the modulated pulse.

As is known to one skilled in the art, a "constant frequency modulation" is routinely used to effect a slice shift in MRI pulse sequences, i.e. a shift of the central frequency. In these claims we propose a frequency modulation which is not a fixed value throughout the pulse, but is oscillating rapidly.

According to a second aspect of the invention there is provided a method of performing nuclear magnetic resonance measurements to analyze a sample (which may be of any type whatsoever, including living subjects), comprising:

providing at least one magnet generating a magnetic field $B_0$ which is substantially static during the experiment and substantially spatially uniform over the sample volume, the magnetic field direction defining a z-reference axis along the longitudinal direction of the magnet;

providing at least one $B_Z$ field coil ('gradient coil') and applying a signal to the coil resulting in a $B_Z$ magnetic field which in addition to the $B_0$ field is applied to form a variable magnetic field in which the sample is located, the $B_Z$ field coil producing a $B_Z$ field component generating a $B_Z$ magnetic field (a magnetic field in the z-direction) which is spatially varying over at least part of the sample;

providing at least one radio frequency (RF) coil and applying an RF signal (normally in the form of pulses) to the RF coil to generate an RF field $B_1$, the RF coil and sample having characteristics such that the resultant RF field generated is non-homogeneous (spatially non-uniform) over at least part of the sample;

and compensating at least partially for the effects of the non-homogeneity of the RF $B_1$ field by applying a signal to the $B_Z$ gradient coil and producing a $B_Z$ field, during the application of the RF $B_1$ field.

Preferably the $B_Z$ field is arranged such that the rotational or precessional effects of the fields on the nuclear spins are correlated.

Preferably the spatial variation of the $B_Z$ field resulting from applying a signal to the $B_Z$ gradient coil is arranged such that the spatial field pattern is a function of a flip angle distribution (which is dependent on the $B_1$ field distribution) of the sample obtained in the absence of the signal applied to the $B_Z$ component.

Preferably the signal applied to the $B_Z$ field gradient coils is applied simultaneously with the applied RF signal.

Preferably the signal applied to the $B_Z$ field coil is arranged such that the resultant $B_Z$ field is time dependent and is spatially correlated with the $B_1$ field.

Preferably the signal applied to the $B_Z$ field coil is arranged so as to produce off-resonance conditions in regions of high $B_1$ field.

Preferably said at least one $B_Z$ field gradient coil comprises a plurality of independently and/or dependently driven $B_Z$ field gradient coils.

Preferably the signal applied thereto is arranged such that the $B_Z$ field changes over time.

Preferably the time variation is a function of position.

Preferably the signal applied to the $B_Z$ field coil and the $B_Z$ field produced is an substantially oscillating function such as a cosine function or a sine function or a square wave function.

Preferably the $B_Z$ field produced by the gradient coil and the $B_1$ field have parallel isocontours over at least part of the sample volume.

Preferably the $B_Z$ field produced by the $B_Z$ gradient coil is substantially uniform over regions of the sample where the $B_1$ field is uniform.

The method as defined above has the following features:

a) Uses additional $B_Z$ gradient fields, to spatially modify the response of RF pulses;

b) The gradient coil field profile Is designed to be correlated with the $B_1$ field profile. This allows the frequency shifts, due to the $B_Z$ waveform, to compensate for the effects of the spatial variation in the $B_1$ amplitude.

c) Simultaneous $B_1$ and $B_Z$ pulses are used to produce 'Correlated Rotations' (COR). This provides greater control over the spin system than using $B_1$ pulses alone.

d) The general ideas expressed here can be used to design specific instances (specific pulses). Building on these ideas, other specific pulses can be designed, which may be superior to the examples given here.

e) COR pulses can be used on existing NMR equipment, however there are a number of hardware and software modifications which are suggested by this work.

f) COR pulses allow the theoretical absolute minimum RF power to be used, because the compensation is performed by the gradient coil, rather than by the $B_1$ waveform, this introduces the possibility that, for some COR pulses, the pulse duration and pulse voltages can be the absolute minimum. Some of the pulses shown hereinafter use a square RF pulse, which is the most efficient pulse for on-resonance spins.

g) The COR pulse method also simplifies RF pulse sequences, and shortens the pulse sequence.

h) Comparison with adiabatic pulses; adiabatic pulses, and some composite pulses, vary the frequency globally (i.e. over the whole sample), there being no correlation between $B_1$ ad $B_Z$ fields. Pulses which vary the frequency as a (fixed) function of position we will denote as 'COR1 pulses', and those which vary the frequency as a time-dependent function of position: 'CORM pulses'. Note that COR pulses do not necessarily rely on frequency sweeps, although some COR pulses do have this feature.

BRIEF DESCRIPTION OF THE DRAWINGS

Embodiments of the invention will now be described in conjunction with the accompanying drawings in which:

FIG. 1 is a schematic illustration of the equipment employed in a nuclear magnetic resonance experiment.

FIGS. 2A, 2B, 2C and 2D show one example of a COR Inversion pulse where:

FIG. 2A shows the $B_1$ waveform which is a rectangular pulse of 3 ms duration;

FIG. 2B shows the $B_Z$ waveform which consists of 3 sections, the first being negative, the second zero and the third positive in which the total duration of the $B_Z$ is also 3 ms;

FIG. 2C shows the $B_1$-$B_Z$ correlation function, which is a continuous function between $B_1$ amplitude values of approximately 200 degrees to 540 degrees so that this specifies the required $B_Z$ field amplitude as a function of the $B_1$ amplitude;

FIG. 2D shows the inversion response of the magnetization ($M_Z$ component) to this pulse. The $M_Z$ component is equal to −1 over the operating range of this pulse, indicating successful inversion over a range of $B_1$ values greater than 200 degrees to 540 degrees.

FIG. 3A, shows the $B_1$ waveform which is a rectangular pulse of 3 ms duration;

FIG. 3B shows the $B_Z$ waveform which is defined with 25 points and approximates 3 cycles of a cosine function;

FIG. 3C shows the $B_1$-$B_Z$ correlation function, specifying the required $B_Z$ field amplitude as a function of the $B_1$ amplitude;

FIG. 3D shows the response of the $M_Y$ component of the sample magnetization to this pulse, FIG. 3E shows the response of the phase of the transverse magnetization, showing a flat phase response.

FIGS. 4A, 4B, 4C, 4D and 4E show a COR Refocusing pulse where:

FIG. 4A shows the $B_1$ waveform, which is a rectangular waveform of 3 ms duration FIG. 4B shows the $B_Z$ waveform which is approximated by 7 cycles of a cosine function;

FIG. 4C shows the $B_1$-$B_Z$ correlation, specifying the required $B_Z$ field amplitude as a function of the $B_1$ amplitude and includes Table 1 showing the same relationship in tabular form;

FIG. 4D shows the response of the $M_X$ component of the sample magnetization to this pulse which is predominantly equal to zero;

FIG. 4E shows the response of the $M_Y$ component of the sample magnetization to this pulse, which is predominantly equal to −1.

FIGS. 5A, 5B, 5C and 5D show a Slice-Selective COR Inversion pulse where:

FIG. 5A shows the $B_1$ waveform, which is a shaped waveform, which is a pulse from the prior art which has desirable slice selective properties;

FIG. 5B shows the $B_Z$ waveform, which is a 40 cycle time-symmetric sinusoidal waveform with 40 cycles during the 3 ms pulse;

FIG. 5C shows the $B_1$–$B_Z$ correlation function, specifying the required $B_Z$ field amplitude as a function of the $B_1$ amplitude;

FIG. 5D shows the inversion response ($M_Z$ component) of the sample magnetization following this pulse. Responses are shown in a stacked form for $B_1$ values ranging from 180 to 800 degrees. The range of frequency offsets shown is from −6000 Hz to +6000 Hz.

FIG. 6A shows a $B_1$ insensitive Excitation pulse where the pulse in the form of $B_X$, $B_Y$, and waveforms. This representation is entirely equivalent to one of the phase modulated $B_X$ and $B_Y$ waveforms. This is because in NMR a change in $B_Z$ is equivalent to a change in the frequency (or phase which is the integral of frequency). The alternative phase modulated representation is used in FIGS. 7A–7F for the description of a different pulse.

FIGS. 7A, 7B, 7C, 7D, 7E and 7F show a B1-Insensitive Slice-Selective Refocusing Pulse where:

FIG. 7A shows the $B_{1X}$ component of the pulse (real component);

FIG. 7B shows the $B_{1Y}$ component of the pulse (imaginary component);

FIG. 7C shows the $M_Z$ response of spins initially at equilibrium to this pulse for a range of $B_1$ values from 450 to 900 degrees (flip angle produced in the absence of modulation);

FIG. 7D shows the $M_Z$ response of this pulse for a single value of $B_1$ (equivalent to 700 degree flip angle in the absence of modulation), showing aliasing near the modulation frequency;

FIG. 7E shows the $M_Y$ response to this pulse over a range of $B_1$ values (450 to 900 degrees);

FIG. 7F shows the a component of the spinor response, a value of +1 indicates a rotation of 180 degrees about the x-axis, which is the desired response for this pulse. $B_1$ range 560 degrees to 840 degrees, frequency offsets +/−5000 Hz.

DETAILED DESCRIPTION

Figure 2D:
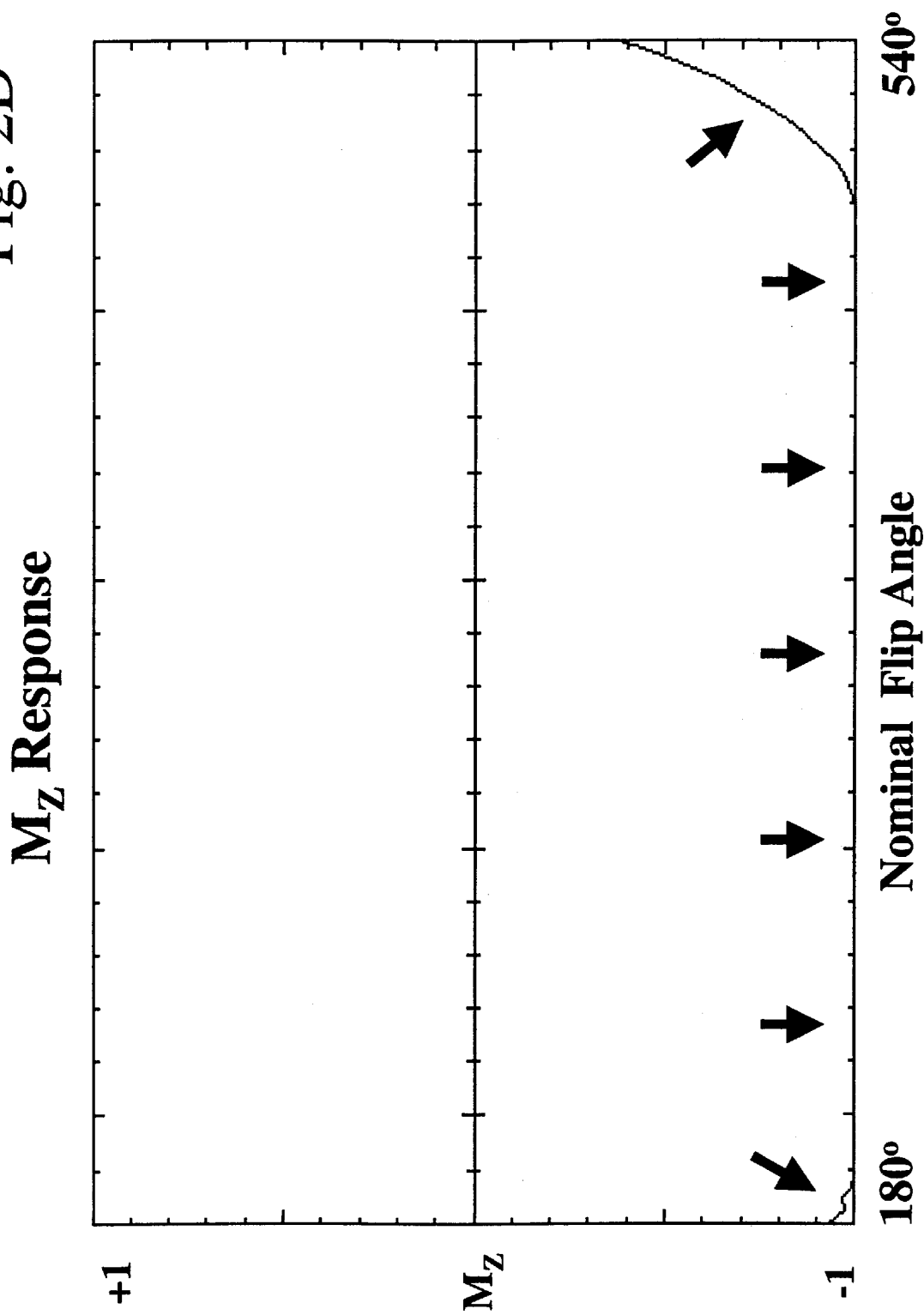

A conventional nuclear magnetic resonance experiment is shown schematically in FIG. 1 for completeness.

The experiment includes a conventional super-conducting magnet 10 having a magnet current supplied by a control unit 11 which generates a high magnetic field. In the case that the magnet is in the superconducting state no external power from the control unit is required. The strength of the magnetic field is determined by the current flowing in the windings of the magnet.

The fine adjustments to the spatial uniformity of the magnetic field is controlled by shim coils 12.

The experiment further includes gradient coils 13 which are arranged to provide controlled variation of the magnetic field in required directions. The currents in the gradient coils are produced by a gradient electronics 16. All of the subsystems are controlled by a central computer system 17.

Thus the longitudinal direction of the main magnetic field is designated as the z-direction and directions at right angles to this direction are designated as the x and y directions. The magnet provides a hollow bore within in which the gradient coils are located so the gradient coils are arranged just inside the magnet bore and surrounding the remaining open area within the magnet for receiving the sample 14. The RF coil is indicated at 15 and is controlled by a RF control system 18 actuated by the main computer 17.

The above arrangements are shown only schematically since the details are well known to one skilled in the art.

Some experiments in spectroscopy do not require the gradient coils which are therefore not provided in an apparatus of this type.

Turning to the first technique herein ($B_1$ insensitive pulses), the first step in the pulse design is to choose a conventional pulse, which will determine the final pulse properties, such as the slice profile. For instance, for excitation this might be a since or gaussian waveform. The $B_1$-insensitive behaviour is a consequence of the phase modulation which is then applied to this initial pulse, $B_{1init}$. A modulated complex waveform $B_1{}^M$ is obtained in the following manner:

$$B_1{}^M = B_{1init} e^{-\beta}$$

A simple example of phase modulation is the use of the function $\beta = \Omega t$, which corresponds to a frequency shift or slice shift of $\Omega$, which is a technique in the prior art. The modulation functions for the $B_1$ insensitive pulses claimed here are of the form:

$$\beta(t) = 2\pi D \int^1{}_0 \cos(\phi + \omega t^1) dt^1$$

preferably with the condition that $\omega >>$ slice bandwidth in the case of slice selective pulses. D and $\phi$ are constants. For a slice selective pulse, the frequency response of the modulated version is that of the unmodulated pulse (the initial pulse $B_{1init}$) for frequencies less than approximately $\omega$. As $\omega$ is increased, the RF power level required also increases.

Results are shown below for a $B_1$-insensitive selective refocusing pulse. The starting point for the design was an analytically designed selective $\pi$ refocusing pulse (1) with a pulse length, tp, of 3 ms, bandwidth 3 kHz, and a peak amplitude of 2850 Hz. The phase modulation used was the anti-symmetric function:

$$\beta = 1.751 \sin(2\pi 40(t-tp/2)/tp)$$

The symmetry of this pulse ensures that the rotation axis for all spins is in the xz-plane. The excellent slice profile of the original pulse is maintained in the $B_1$-insensitive version.

In the following figures, $B_1$ intensity is referred to in terms of the flip angle that would be produced in the absence of the phase modulation.

These pulses typically operate over a $B_1$ intensity range of the order of 50% to 100%. Results for phase-modulated selective excitation pulses indicate analogous behaviours to the refocusing pulse shown here.

Figure 4B:
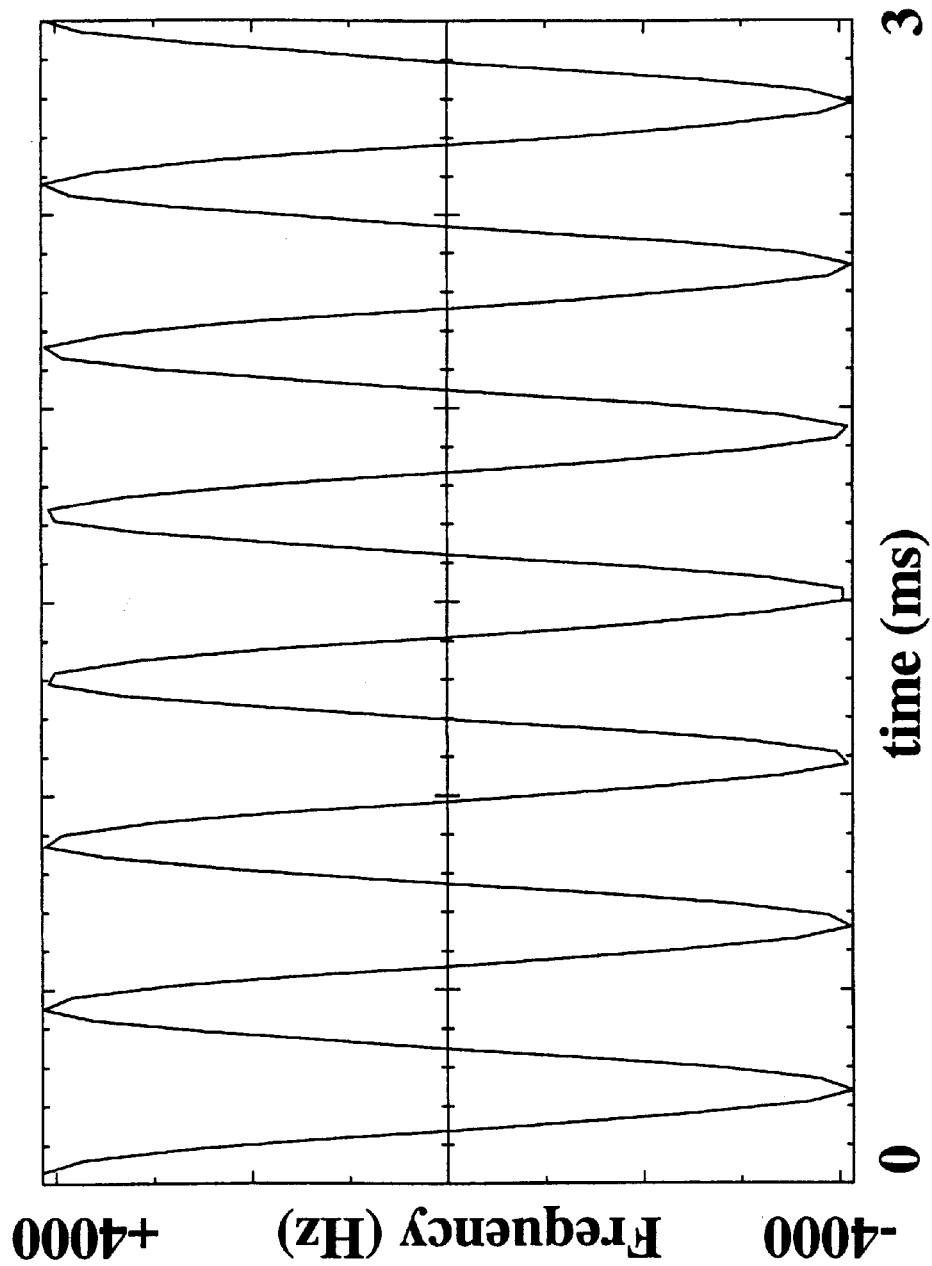
Figure 5A:
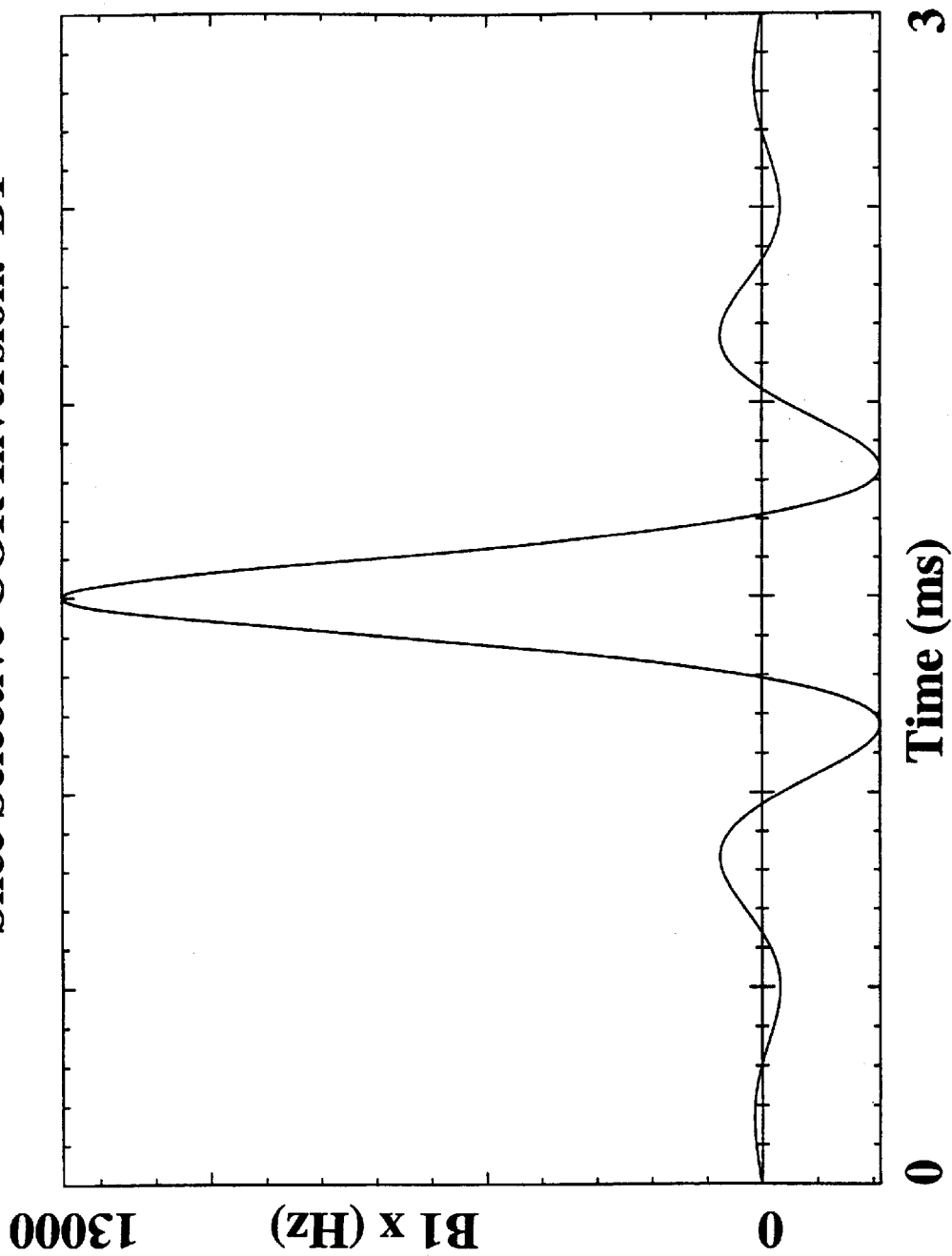
Figure 5D:
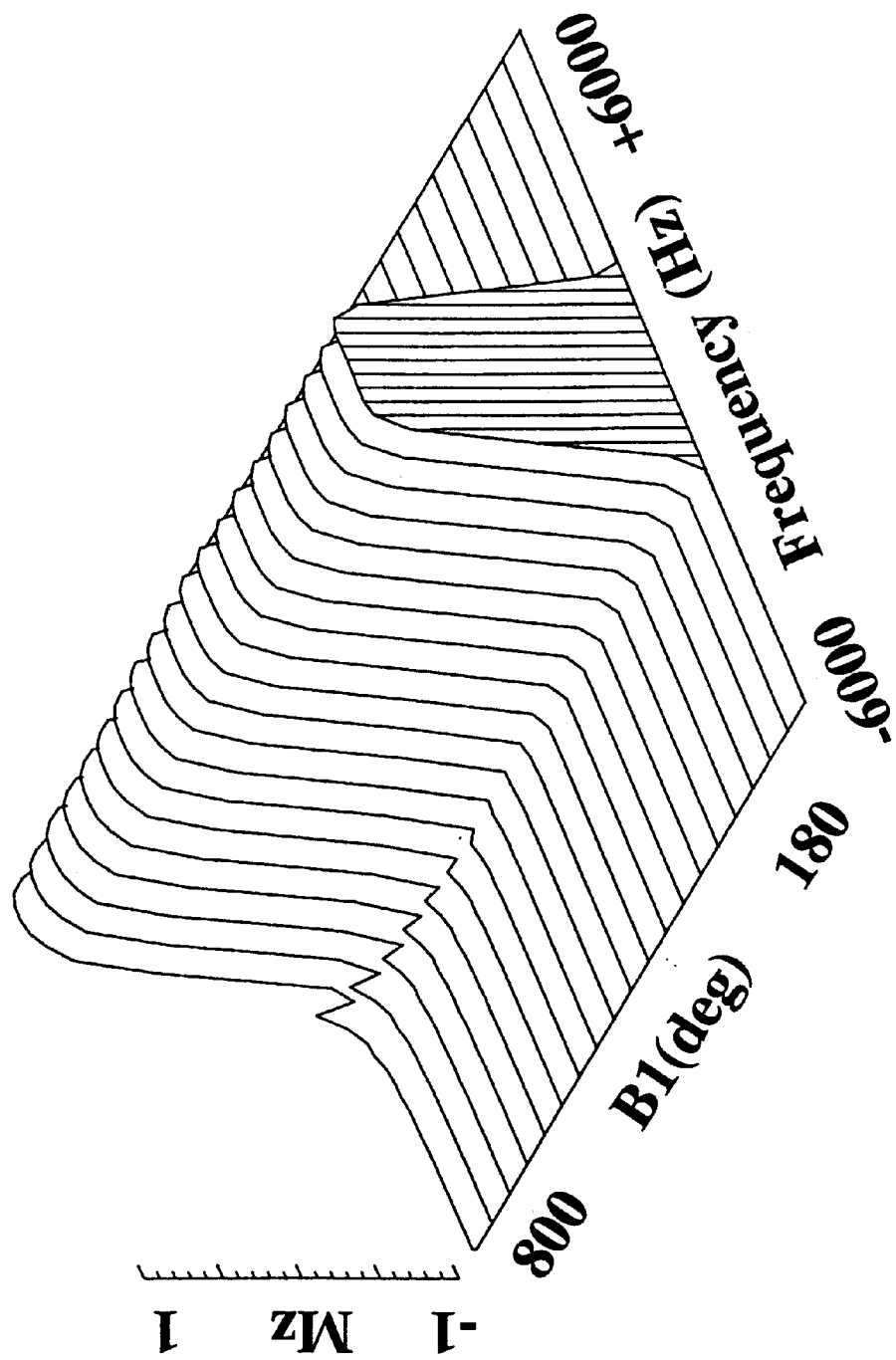
Figure 7B:
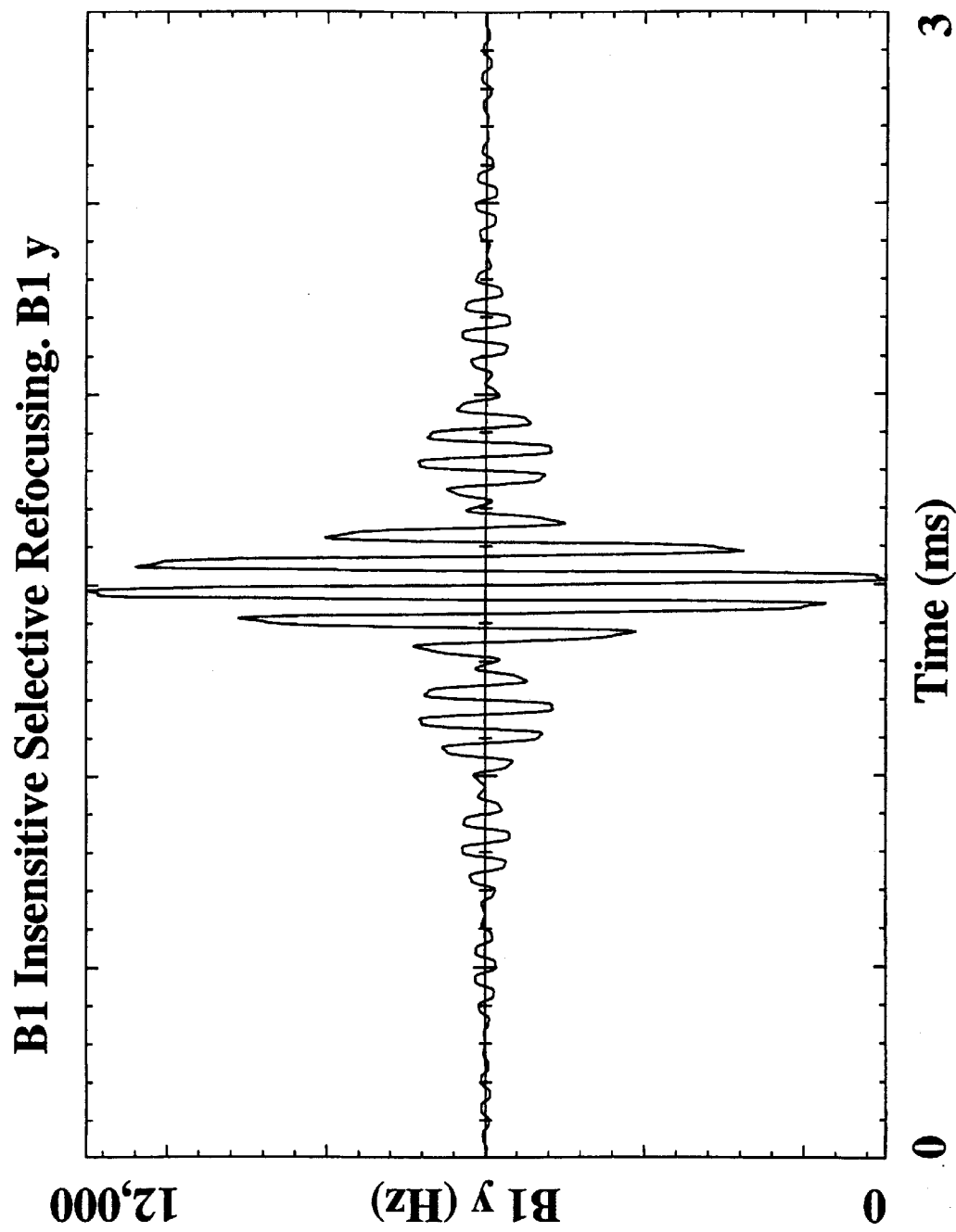
Figure 7C:
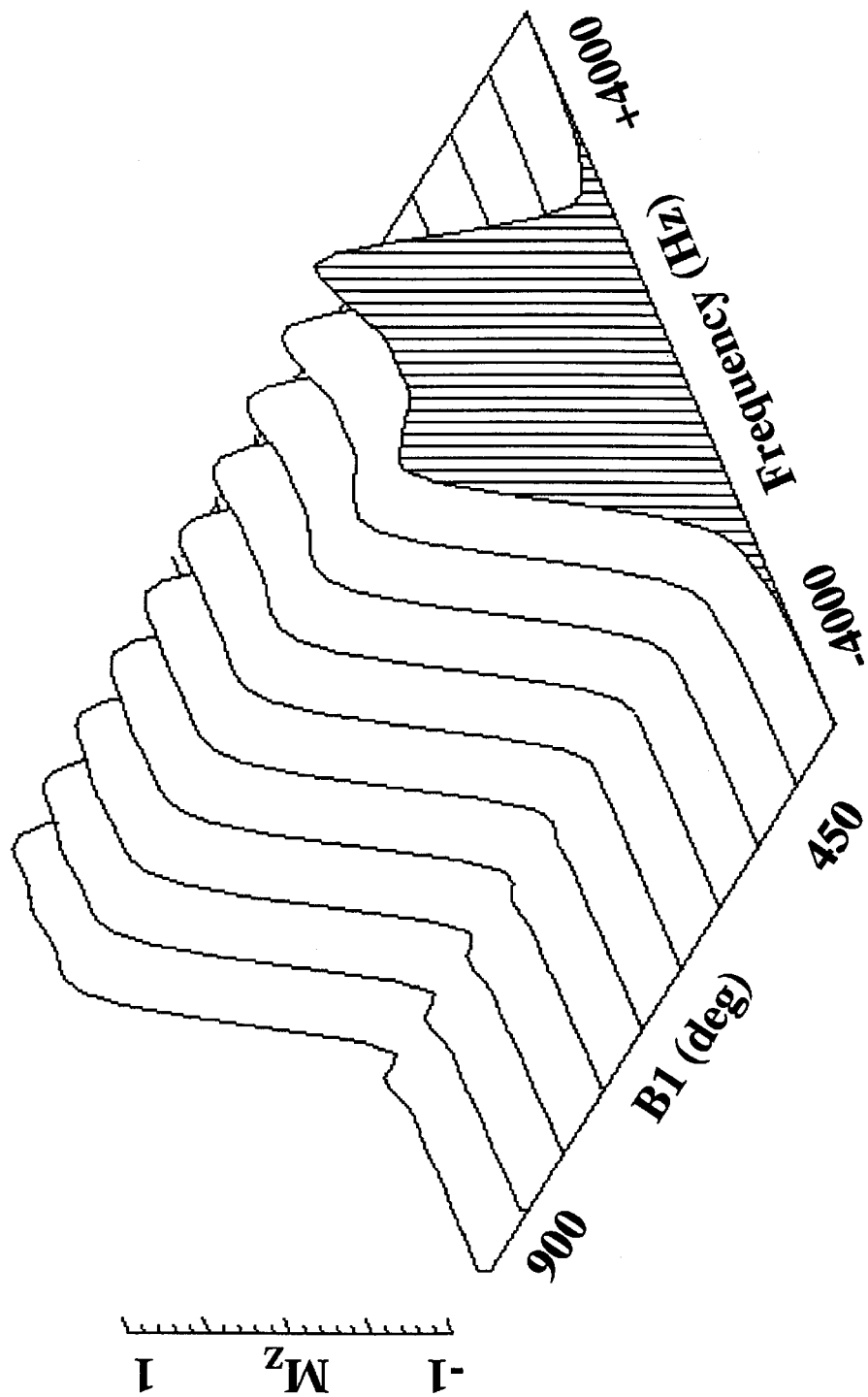
Figure 7D:
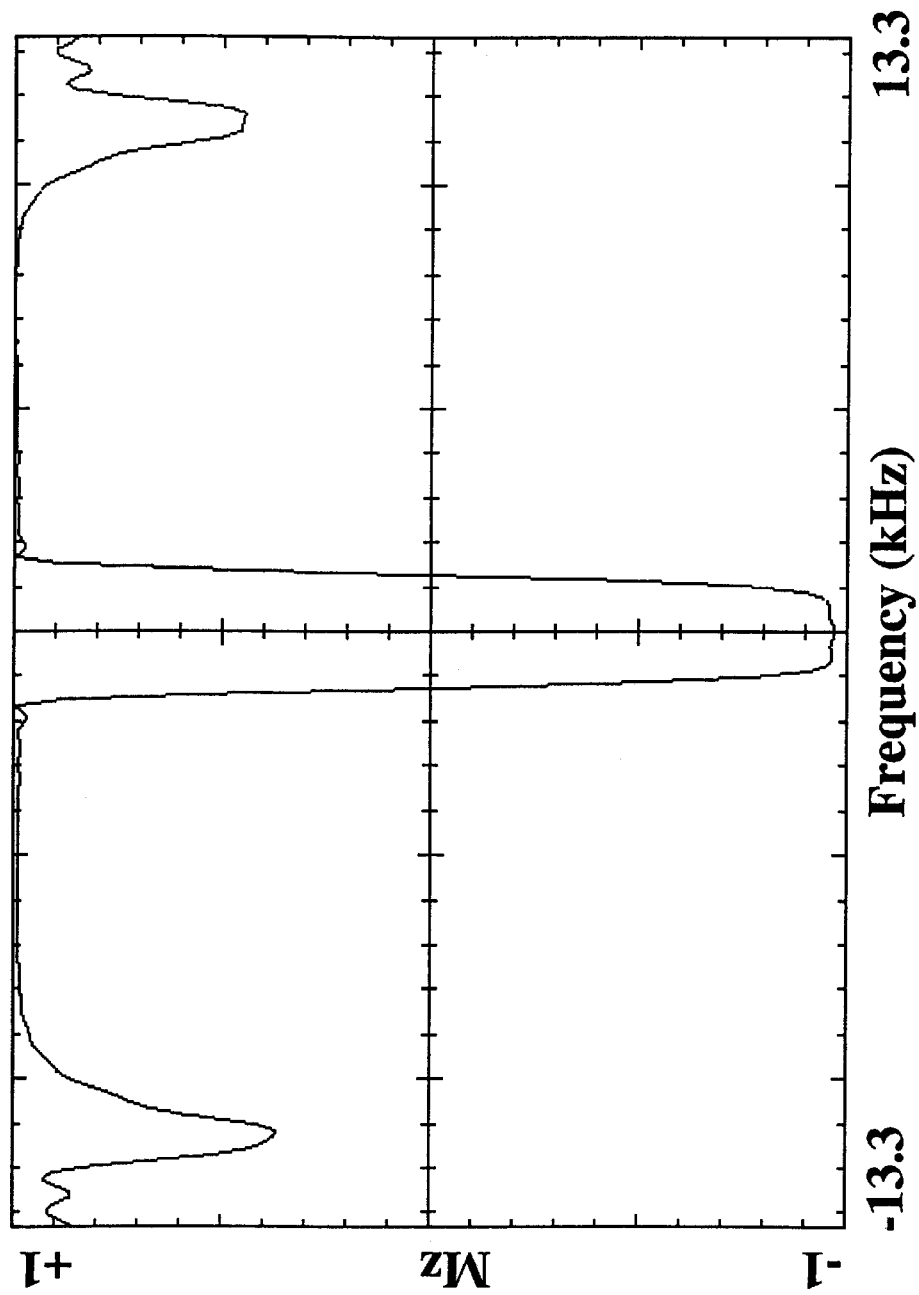
Figure 7F:
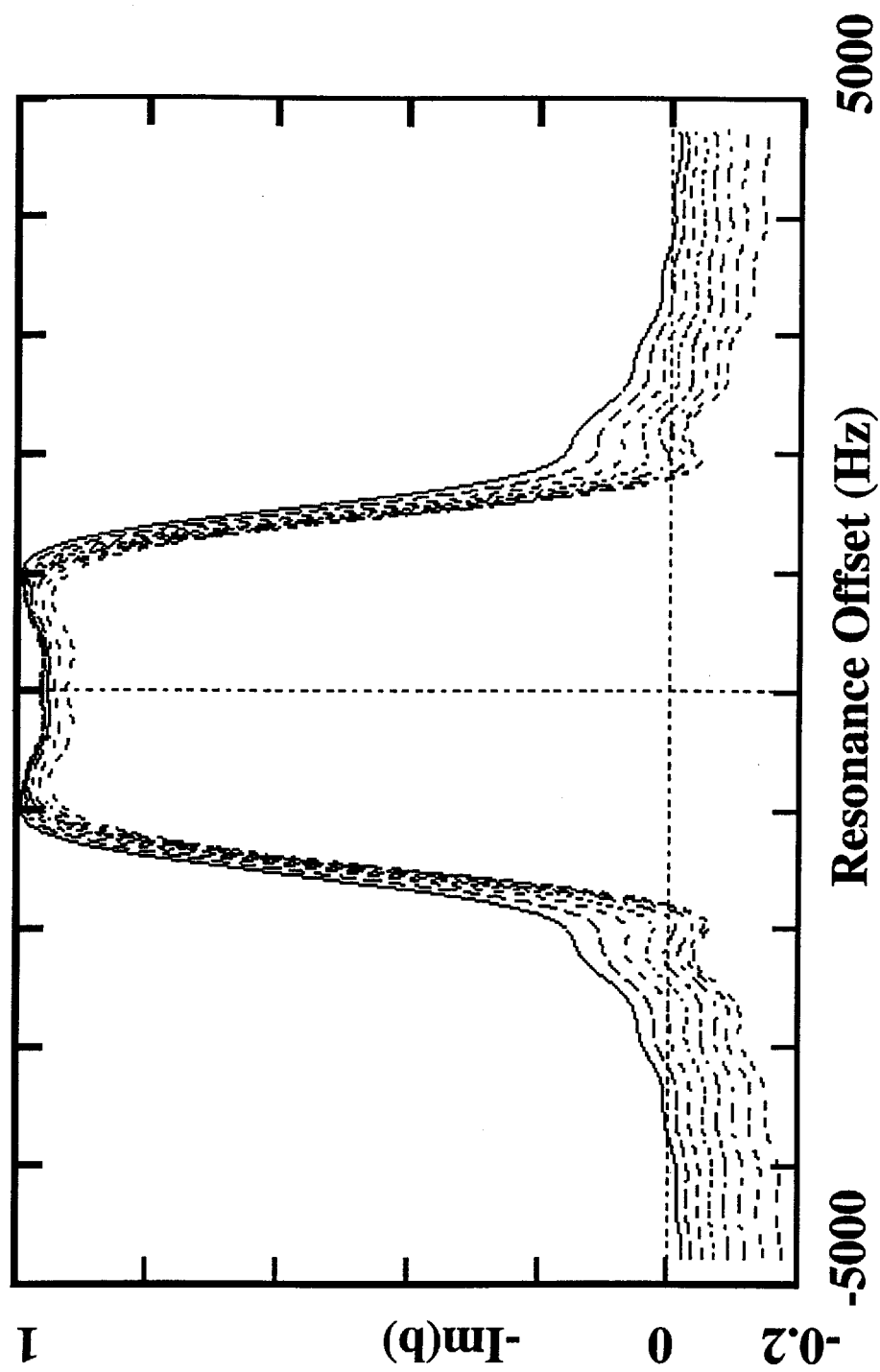

The COR pulses shown in FIGS. 3, 4, 5 can also operate as $B_1$ insensitive pulses (that is without the requirement for spatially varying $B_Z$ fields) over the ranges of $B_1$ where the $B_Z$ value is almost independent of the $B_1$ value, This is a link between COR pulses and $B_1$ insensitive pulses.

The $B_1$ insensitive pulses can be implemented as COR pulses by adding a spatially dependent $B_Z$ field.

Conversely some COR pulses have regions of operation where they do not require spatially varying $B_Z$ fields and thus become the equivalent to the $B_1$ insensitive pulse over the range of $B_1$ values.

The extra degrees of freedom provided by using a spatially varying $B_Z$ field results in COR pulses exhibiting immunity to $B_1$ intensity variations over a wider range of $B_1$ values than is possible with the $B_1$ insensitive pulses. COR pulses are therefore suitable for use with surface coils which have a wider range of $B_1$ values.

Turning now to the second aspect of the invention (COR Pulses) utilizing pulses applied to the gradient coils to produce a $B_Z$ field, the procedure required to generate the $B_Z$ pulse is as follows:

1. An experiment is carried out using the $B_1$ pulses of the required shape in the absence of modification of the $B_Z$ field to obtain a flip angle distribution over the volume of the sample 14. An alternative procedure is to use theoretical calculations to obtain the same information.

2. The required $B_Z$ field pattern is calculated for the COR pulse. Given specified $B_1$ and $B_Z$ waveforms it is a simple matter to calculate the required amplitude of the $B_Z$ waveform required for each amplitude of $B_1$ waveform to achieve the desired magnetization response. This may be done using a computer program simulation of the pulses and spin system response. By examining the magnetization response as a function to $B_1$ intensity and $B_Z$ intensity it is straightforward to find one or more functions relating $B_1$ to $B_Z$ which give the required response.

3. It may be useful to analyze the $B_Z$ field pattern in terms of a spherical harmonic expansion in order to determine the currents needed in the gradient coils to produce the required $B_Z$ field. This field analysis technique is prior art.

4. The $B_Z$ field required is then produced with gradient system. There may be physical and technological restrictions that preclude the exact required field from being realized.

The following is a first example of the COR1 pulses described herein defining a single gradient wave form for use with one or more gradient coils. Let θ be the flip angle produced on-resonance at a location (x,y,z) by a given real RF pulse. Let $\theta_0$ be the desired flip angle. In this example we shall assume $\theta_0 \leq \pi$.

Consider spatial locations (x,y,z) where these different conditions hold:

Firstly, $\theta < \theta_0$ for example distant from the coil, it is impossible to achieve the desired flip angle with the given pulse, even if $B_Z(t) \neq 0$. The $B_1$ field is too weak.

Secondly, $\theta = \theta_0$, the $B_1$ field produces exactly the desired flip angle, $B_1 = B_1^{min}$, with $B_Z = 0$. We define $B_1^{min}$ to be the minimum field necessary to produce the desired flip angle $\theta_0$.

Thirdly, $\theta > \theta_0$. the $B_1$ field is too intense, and the flip angle produced by the $B_1$ field alone is too large. For this case, the desired $\theta_0$ flip angle can still be produced if the $B_Z$ field is used to modify the spin behavior, as a function of the $B_1$ field.

The three dimensional RF field $B_1(x,y,z)$ determined by the RF coil and the sample, may be mapped onto a one-dimensional function $B_1(\theta)$ given by:

$$B_1(\theta) = \frac{\theta(x, y, z)}{\theta_0} B_1^{min}$$

For a square RF pulse, of duration T, $B_1^{min}$ is given by:

$$B_1^{min} = \theta_0 / \gamma T.$$

For implementation of a COR pulse we shall require that the $B_1$ and $B_Z$ field patterns have substantially parallel, but not, in general, equally spaced, isocontours, over the sample volume. If this requirement is fulfilled, then $B_Z$ may be written as a function of θ:

$$B_Z(\theta, t) = f(\theta) w(t),$$

where f(θ) and w(t) are functions are determined by the COR pulse design. If a single gradient waveform is used (COR1 pulses) then f(θ) cannot be a function of time. For gradient coil design and adjustment, the coordinate mapping $\theta \leftrightarrow (x,y,z)$ must be known over the sample volume, that is the flip angle as a function of position must be known.

Either a single gradient coil or, more flexibly, a set of gradient coils is used to build-up the desired f(θ) function for each pulse. It is not necessary for each individual gradient coil to be matched to the $B_1$ field. Each gradient coil is driven with a scaled version of the waveform w(t). This is analogous to normal shimming where a set of coils is used, and where the 'waveform', w(t) is trivially a DC current. The amplifier gains need to be adjusted individually, but they can all be driven from single waveform source:

$$B_z(\theta, t) = f(\theta) w(t) = w(t) \sum_{coil} a_{coil} P_{coil}(x, y, z),$$

where $a_{coil}$ is a scalar, and $P_{coil}(x,y,z)$ is a function proportional to the BZ field pattern of the coil. Note that, for this case, $B_Z$ is separable in terms of θ and t.

A COR1 pulse consists of three functions:

$B_1(t)$—the RF waveform—for the simplest cases this can be just a rectangular (hard) pulse.

w(t)—The $B_Z$ waveform f(θ)—The relationship between the $B_{ixy}$ and $B_Z$ field patterns.

The other part of the design process is the implementation on a specific RF probe, sample and gradient system. The $B_1$ field pattern, and the chosen f(θ) function, will determine the initial target $B_Z$ field. There are physical and technological restrictions on the $B_Z$ fields which can be generated, however.

For several reasons, the $B_{ixy}$ and $B_Z$ field patterns will not be dentical:

$\nabla \times B1 \neq 0$ (RF currents may be induced in the sample), but $\nabla^2 B_Z = 0$ (gradient coils obey Laplace equation.)

The $B_1$ field is in the transverse xy plane, but the $B_Z$ field is in the z-direction, the f(θ) function, arising from the pulse design, and relating the two fields is, in general, not linear.

An alternative design procedure that may be therefore also be necessary is to perform the pulse design in the reverse direction, i.e. given the $B_1$ field and the gradient system, to design $B_1(t)$ and w(t) around the available range of f(θ) functions for the specified sample volume.

EXAMPLE 1

COR1 Inversion Pulse (non-selective)

For this example we choose the following:

a square RF waveform, which has the absolute minimum RF power (for on-resonance spins);

$\theta_0 = \pi$ which is an inversion pulse;

a single gradient waveform: square bipolar gradient pulses, in the ratio: −1:0:+1 in 3 equal time periods.

Given these constraints, the design process for the pulse consists in finding a function f(θ) which produces the desired performance.

The results are shown in FIG. 2.

For a square $B_1$ pulse, almost perfect inversion was obtained over a range $\pi \leq \theta \leq 3\pi$. For a 3 ms pulse, $B_1 \sim 170$ Hz (at 180°) the maximum $B_Z$ required is $B_Z \sim 360$ Hz for $\theta \sim 2\pi$. The function f(θ) varies smoothly over this range. There is a discontinuity in f(θ) just above 3π. f(θ) is smooth again for the range $3\pi \leq \theta \leq 5\pi$, but f(θ) just above 3π is approximately 830 Hz. In general for this pulse: f(2n+π)=0 Hz will produce inversion.

In practice, the pulse can only operate on one side of the discontinuity as it will be difficult to produce a gradient field with a step. Note that f(θ) is not a single-valued function, therefore it may be possible to find f(θ) functions which are continuous over a wider range than 2π, for inversion.

Further examples of CORM pulses are described as follows including multiple gradient waveforms and multiple coils.

This is a more general class of pulses offering significantly greater flexibility (Correlated Rotation Multiple waveforms). The $B_1 - B_Z$ relationship now becomes a function of time, i.e. the function f(θ) varies during the pulse. To achieve this, more than one gradient waveform is needed. The most general case is for each gradient coil in the set to have an independent gradient waveform:

$$B_z(\theta, t) = \sum_{coil} w_{coil}(t) a_{coil} P_{coil}(x, y, z).$$

Note that $B_z(\theta,t)$ is no longer separable in terms of θ and t. We can say that f(θ) has become a function of time, or equivalently, that the $B_Z$ waveform, w(t), has become a function of position.

A CORM pulse consists of:

$B_1(t)$ −RF waveform $B_Z(\theta,t)$ −2D $B_Z$ function $B_z(t)$ becomes a two-dimensional function, $B_z(\theta,t)$ which may be mapped to a four-dimensional function $B(x,y,z,t)$. CORM pulses allow greater freedom in design. COR 1 pulses are a subset of CORM pulses.

See FIG. 3 for an example of an non-selective COR1 excitation pulse. This pulse excites satisfactorily over the range 90°... 800° and is therefore suitable for use with surface coils.

See FIG. 4 for an example of a non-selective COR1 refocusing pulse. This pulse performs over the range: 180°... 450°.

Slice selective pulses are the most important type of pulse used for MR imaging. The basic pulses used are 90° selective excitation and 180° selective refocusing pulses. See FIG. 5 for an example of a selective COR1 inversion pulse.

The $B_1$ field pattern is influenced by a number of physical effects including the properties of the sample. An in situ imaging method to map the $B_1$ field in the sample will be useful in these cases. In medical NMR applications, the $B_1$ field is often optimized for sensitivity, at the expense of field uniformity. Therefore, even in the absence of a sample, the $B_1$ field may be non-uniform.

Phase variation of the RF-field as a function of position does not matter, when using a single RF coil, because the phase is the same for reception as it is for transmission.

Correction for RF eddy currents within the sample will have to take into account different samples exhibiting different amounts of loading, producing different $B_1$ distributions.

The methods described can also be used with quadrature coils or phased-array coils.

A description of the range of the $B_1$ field patterns expected from a given coil/sample arrangement would normally be required in order to design a gradient coil system.

A matching RF coil/gradient set will be required.

The steps required are as follows:

a) obtain a description of $B_{1xy}$.
b) Specify the mapping function $B_1$ to $B_z$ required for the pulse. Use this to specify the spatial form of the required gradient. In general this will be a function of the coil, the sample and the particular pulse used.
c) Design a gradient coil set which can produce the range of target fields required. The target field must satisfy Laplace's equation. Existing shim or gradient coils may be suitable, depending on the hardware and if driven suitably. Waveform hardware for gradient switching will be required. For CORM pulses a number of different gradient waveforms will be required.

In general, different pulses will require different $f(\theta)$ functions. It is therefore desirable to be able to get to generate a range of $f(\theta)$ functions, given a particular RF field. One way to approach this is to describe the $f(\theta)$ functions in terms of an orthogonal expansion. The gradient system will then be able to produce $f(\theta)$ functions for which it can produce the corresponding terms in the expansion.

One way to constrain the $f(\theta)$ function to be smooth, is to use a Fourier description in the design process.

Even given perfectly uniform and correct flip angles, a non-uniform coil will still exhibit a non-uniform reception response. To an extent this can be mitigated by modifying the excitation angle as a function of $B_1$ intensity. This type of correction can be incorporated into the pulse COR design.

The following steps are an example of the procedures to be carried out for one practical implementation:

1. Obtain an description of the $B_1$ distribution for a given coil and sample. This may be obtained either from theory or experimentally by field measurements.

2. Select a COR1 pulse and $f(\theta)$ function—or select a family of pulses which have the same or related $f(\theta)$ functions 3. Calculate the required $B_z$ field pattern 4. Iterate and modify the pulse design(s) until the $B_z$ field consists of spherical harmonics (i.e., obeys Laplace's Eqn) and is achievable with the given equipment. Alternatively, new equipment could be designed and constructed at this stage.

FIGS. 2A, 2B shows one example of an Inversion COR1 pulse (non-selective) of $B_z$. The $B_1$ waveform is a rectangular pulse of 3 ms duration in this case. The $B_z$ waveform goes from positive, through zero, to negative.

FIG. 2C shows $f(\theta)$ (i.e. the $B_z$–$B_1$ relationship)

FIG. 2D shows the Inversion response to equilibrium magnetization. This pulse inverts over the range: 180°... 540°.

Figure 3A:
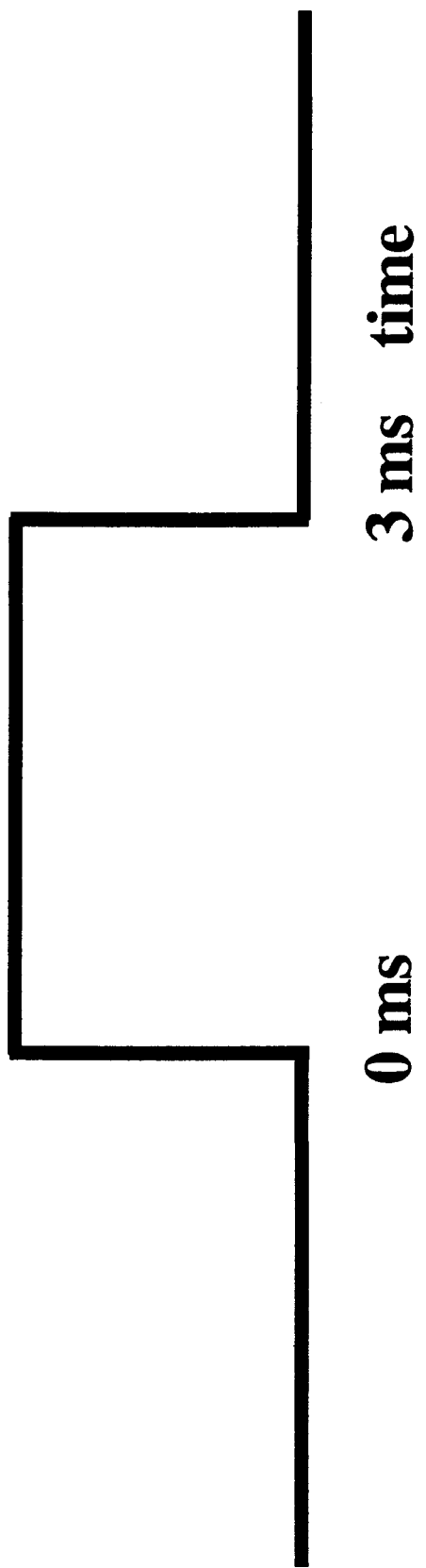
FIGS. 3A, 3B, 3C, 3D and 3E show one example of a COR Excitation pulse where.
Figure 3B:
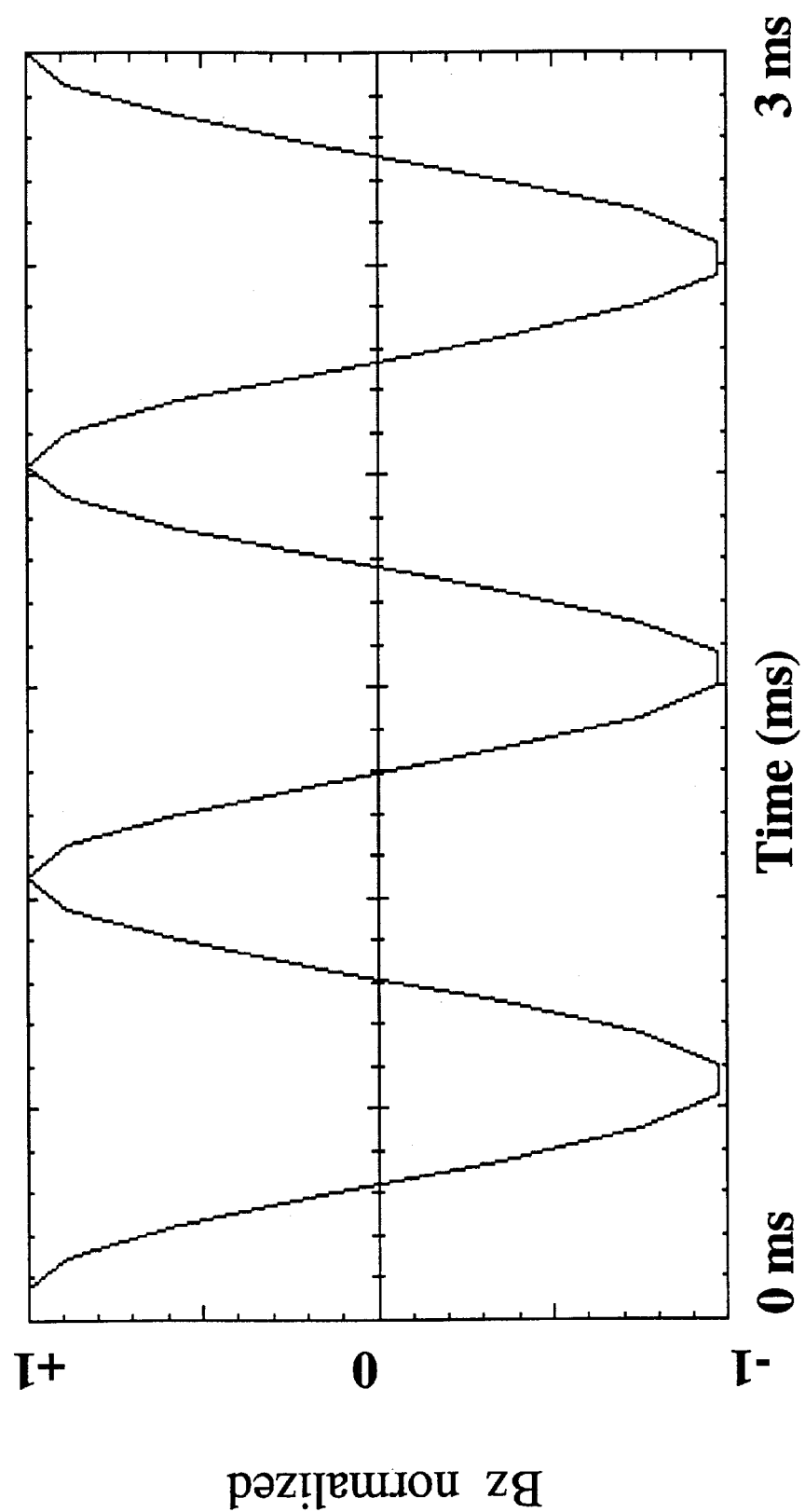

FIGS. 3A and 3B shows a second example of excitation COR1 pulse (non-selective). The $B_1$ waveform is a rectangular pulse, 3 ms duration. The $B_z$ waveform is defined with 25 points and approximates a cosine function (3 cycles).

Figure 3C:
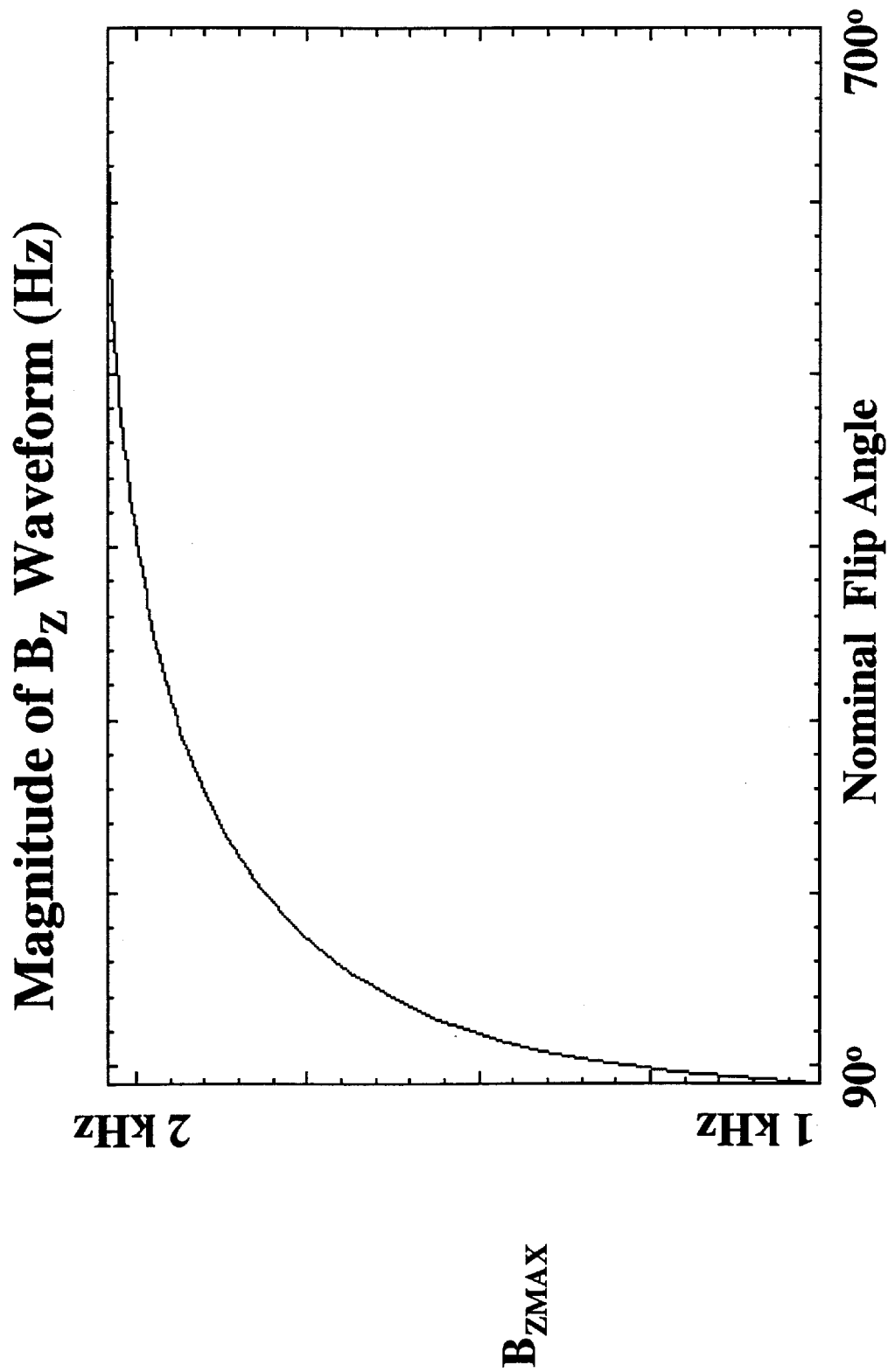

FIG. 3C shows the relationship of $B_1$ and $B_z$, $f(\theta)$. This is initially steep, becoming flat. When the $f(\theta)$ curve is flat, the pulse does not require a spatially varying $B_z$ field. It is easier to implement pulses if the $f(\theta)$ curve is not too steep.

Figure 3D:
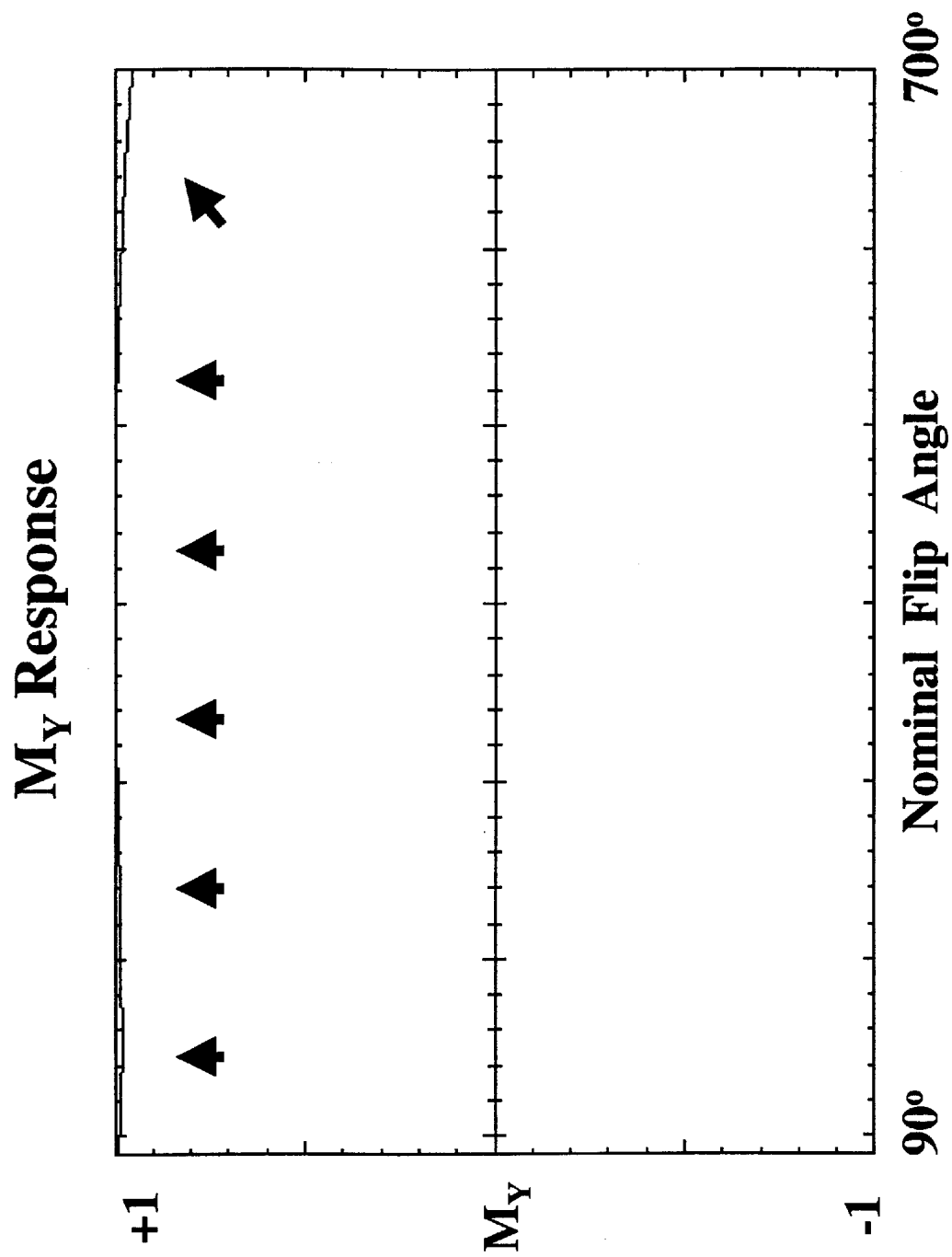

FIG. 3D shows the $M_Y$ response. As shown, this pulse excites satisfactorily over the range 90°... 800°.

Figure 3E:
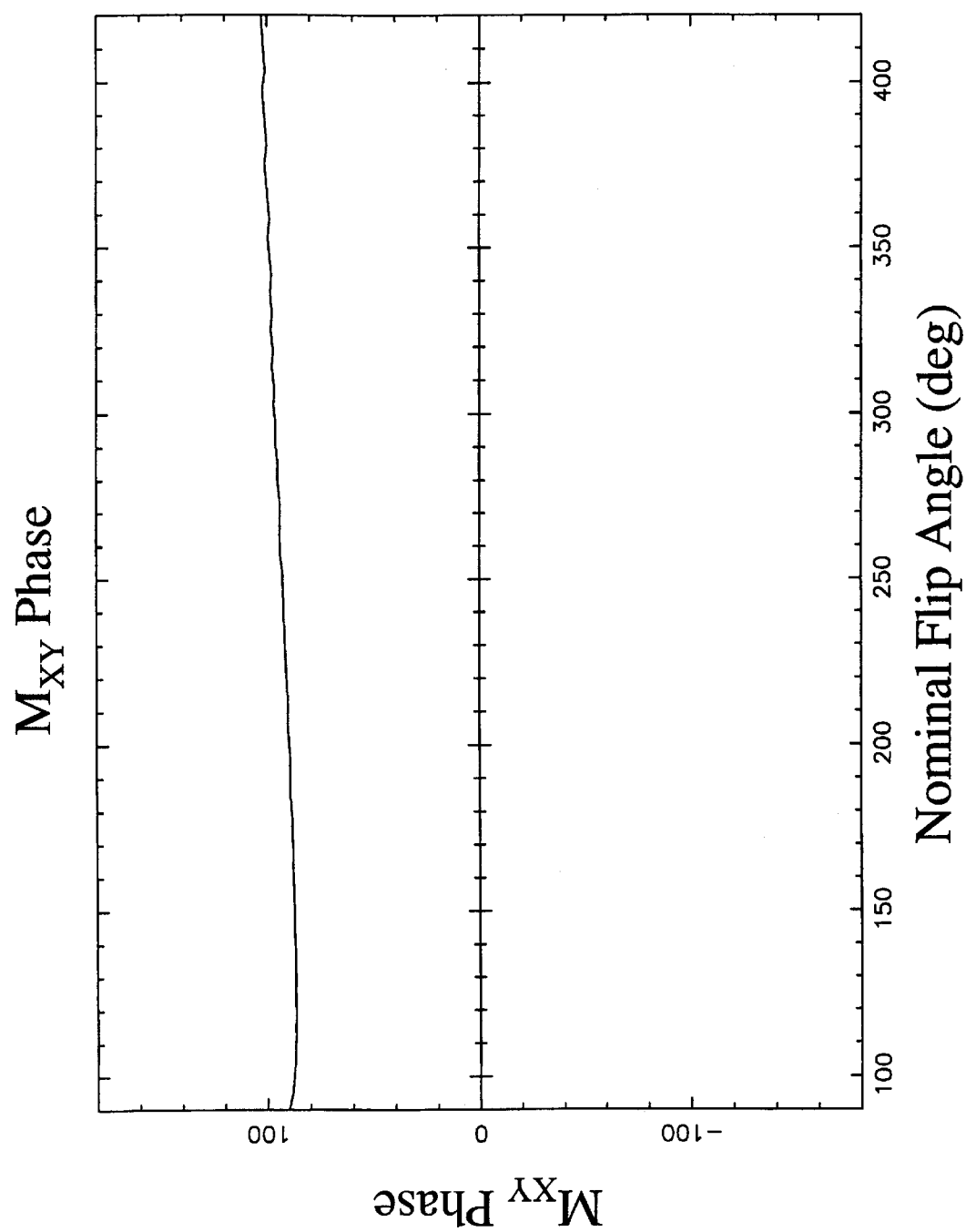

FIG. 3E shows the phase response of $M_{xy}$. The phase response is reasonably flat.

FIG. 4 shows a refocusing COR1 pulse (non-selective). The B1 waveform is a rectangular pulse, 3 ms duration. This pulse has some similarities with the excitation pulse, FIG. 2. This pulse performs over the range 180°... 450°.

FIG. 4B $B_z$ waveform, cosine function (7 cycles).

FIG. 4C $f(\theta)$—as a table

Initial magnetization was Mx=0, Mz=0

FIG. 4D $M_X$ response, close to zero.

FIG. 4E $M_Y$ response, close to −1.

For the case of a non-selective pulse a single cycle of frequency modulation can be used.

In this case the frequency modulation is of the order of that of the original bandwidth of the pulse.

This pulse is shown in FIG. 6.

Since various modifications can be made in my invention as herein above described, and many apparently widely different embodiments of same made within the spirit and scope of the claims without departing from such spirit and scope, it is intended that all matter contained in the accompanying specification shall be interpreted as illustrative only and not in a limiting sense.

I claim:

1. A method of performing magnetic resonance measurements to analyze a sample, comprising:

providing at least one magnet generating a $B_0$ magnetic field which is substantially static during the experiment and substantially spatially uniform over the sample volume, the $B_0$ magnetic field direction defining a z-reference axis along a longitudinal direction of the magnet;

providing at least one $B_z$ gradient field coil having a construction arranged such that the application of a signal to the $B_z$ gradient field coil results in a $B_z$ gradient field which, in addition to the $B_0$ field, is applied to form a variable magnetic field in which the sample is located and which is spatially varying over at least part of the sample;

providing at least one radio_frequency (RF) coil and applying an RF signal to the RF coil to generate a $B_1$ RF field, the RF coil and sample having characteristics such that the resultant $B_1$ field generated is non-homogeneous over at least part of the sample;

during the application of the RF signal to the RF coil to generate the $B_1$ field, applying a signal to the $B_Z$ gradient field coil and thereby producing said $B_Z$ gradient field;

using the $B_0$ field, the $B_1$ field and the $B_Z$ gradient field to perform magnetic resonance measurements to analyze the sample;

and selecting and arranging the signal applied to the $B_Z$ gradient field coil and the construction of the $B_Z$ gradient field coil so as to generate a $B_Z$ gradient field which, at least partially, compensates for deleterious effects of the non-homogeneity of the $B_1$ field.

2. The method according to claim 1 wherein the $B_Z$ gradient field is arranged such that the rotational or precessional effects of the $B_Z$ gradient field and the $B_1$ field on the nuclear spins are correlated.

3. The method according to claim 1 wherein the construction of the $B_Z$ field gradient coil is arranged such that the application of the signal to the $B_Z$ field gradient coil generates the $B_Z$ gradient field which has a spatial field pattern which is a function of a flip angle distribution of the sample dependent on the $B_1$ field distribution obtained in the absence of the signal applied to the $B_Z$ field gradient coil.

4. The method according to claim 1 wherein the signal applied to the $B_Z$ field gradient coil is applied simultaneously with the applied RF signal.

5. The method according to claim 1 wherein the signal applied to the $B_Z$ field gradient coil and the construction of the $B_Z$ field gradient coil are selected and arranged such that the resultant $B_Z$ gradient field is time dependent and is spatially correlated with the $B_1$ field.

6. The method according to claim 1 wherein the signal applied to the $B_Z$ field gradient coil and the construction of the $B_Z$ field gradient coil is arranged so as to produce off-resonance conditions in regions of high $B_1$ field.

7. The method according to claim 1 wherein said at least one $B_Z$ field gradient coil comprises a plurality of $B_Z$ field gradient coils to which signals are applied.

8. The method according to claim 7 wherein the signals applied to the plurality of $B_Z$ field gradient coils are selected and arranged such that the $B_Z$ gradient field changes over time.

9. The method according to claim 8 wherein the signals applied to the plurality of $B_Z$ field gradient coils are selected and arranged such that the time variation of the $B_Z$ gradient field is a function of position.

10. The method according to claim 1 wherein the signal applied to the $B_Z$ field gradient coil and the $B_Z$ gradient field produced is a substantially oscillating function.

11. The method according to claim 1 wherein the signal applied to the $B_Z$ field gradient coil and the construction of the $B_Z$ field gradient coil are selected and arranged such that the $B_Z$ gradient field and the $B_Z$ field have parallel isocontours over at least part of the sample volume.

12. The method according to claim 1 wherein the signal applied to the $B_Z$ field gradient coil and the construction of the $B_Z$ field gradient coil are selected and arranged such that the $B_Z$ gradient field is substantially uniform over regions of the sample where the $B_1$ field is uniform.

* * * * *